United States Patent
Chavan et al.

(10) Patent No.: US 11,404,217 B2
(45) Date of Patent: Aug. 2, 2022

(54) METHODS OF INCORPORATING LEAKER DEVICES INTO CAPACITOR CONFIGURATIONS TO REDUCE CELL DISTURB, AND CAPACITOR CONFIGURATIONS INCORPORATING LEAKER DEVICES

(71) Applicant: Micron Technology, Inc., Boise, ID (US)

(72) Inventors: Ashonita A. Chavan, Boise, ID (US); Beth R. Cook, Boise, ID (US); Manuj Nahar, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 291 days.

(21) Appl. No.: 16/852,284

(22) Filed: Apr. 17, 2020

(65) Prior Publication Data

US 2020/0243267 A1 Jul. 30, 2020

Related U.S. Application Data

(62) Division of application No. 15/843,278, filed on Dec. 15, 2017, now Pat. No. 10,650,978.

(51) Int. Cl.
*H01L 27/115* (2017.01)
*H01L 23/522* (2006.01)
(Continued)

(52) U.S. Cl.
CPC ............ *H01G 4/385* (2013.01); *G11C 11/221* (2013.01); *H01L 27/11507* (2013.01); *H01L 28/56* (2013.01); *H01L 28/91* (2013.01)

(58) Field of Classification Search
CPC .......... H01L 27/11502; H01L 27/0629; H01L 28/40; H01L 28/60; H01L 28/91;
(Continued)

(56) References Cited

U.S. PATENT DOCUMENTS

| 4,882,649 A | 11/1989 | Chen et al. |
| 4,888,820 A | 12/1989 | Chen et al. |

(Continued)

FOREIGN PATENT DOCUMENTS

| CN | 103383933 | 11/2013 |
| EP | 18888291 | 10/2020 |

(Continued)

OTHER PUBLICATIONS

Fan et al., "Ferroelectric HfO2-Based Materials for Next-Generation Ferroelectric Memories", Journal of Advanced Dielectrics vol. 6, No. 2, 2016, Singapore, 11 pages.

*Primary Examiner* — Omar F Mojaddedi
(74) *Attorney, Agent, or Firm* — Wells St. John P.S.

(57) ABSTRACT

Some embodiments include an apparatus having horizontally-spaced bottom electrodes supported by a supporting structure. Leaker device material is directly against the bottom electrodes. Insulative material is over the bottom electrodes, and upper electrodes are over the insulative material. Plate material extends across the upper electrodes and couples the upper electrodes to one another. The plate material is directly against the leaker device material. The leaker device material electrically couples the bottom electrodes to the plate material, and may be configured to discharge at least a portion of excess charge from the bottom electrodes to the plate material. Some embodiments include methods of forming apparatuses which include capacitors having bottom electrodes and top electrodes, with the top electrodes being electrically coupled to one another through (Continued)

a conductive plate. Leaker devices are formed to electrically couple the bottom electrodes to the conductive plate.

20 Claims, 19 Drawing Sheets

(51) Int. Cl.
| | |
|---|---|
| *H01L 23/485* | (2006.01) |
| *H01G 4/38* | (2006.01) |
| *G11C 11/22* | (2006.01) |
| *H01L 27/06* | (2006.01) |
| *H01L 27/11507* | (2017.01) |
| *H01L 49/02* | (2006.01) |

(58) Field of Classification Search
CPC ... H01L 28/56; H01L 23/485; H01L 23/5223; H01G 4/385; G11C 11/221
See application file for complete search history.

(56) References Cited

U.S. PATENT DOCUMENTS

| | | | |
|---|---|---|---|
| 5,041,887 A | 8/1991 | Kumagai et al. |
| 5,132,936 A | 7/1992 | Keswick et al. |
| 5,321,655 A | 6/1994 | Iwahashi et al. |
| 5,559,350 A | 9/1996 | Ozaki et al. |
| 5,566,045 A | 10/1996 | Summerfelt et al. |
| 5,793,600 A | 8/1998 | Fukuda et al. |
| 6,165,834 A | 12/2000 | Agarwal et al. |
| 6,344,965 B1 | 2/2002 | Roh |
| 6,441,423 B1 | 8/2002 | Madelman et al. |
| 6,476,432 B1 | 11/2002 | Basceri et al. |
| 6,710,389 B2 | 3/2004 | Shibata |
| 7,096,548 B2 | 8/2006 | Sakurai et al. |
| 7,285,462 B2 | 10/2007 | Shibata |
| 7,344,939 B2 | 3/2008 | Eliason et al. |
| 7,485,913 B2 | 2/2009 | Ogawa |
| 8,643,074 B2 | 2/2014 | Pai et al. |
| 8,759,193 B2 | 6/2014 | Pai et al. |
| 8,934,283 B2 | 1/2015 | Matsudaira et al. |
| 8,969,937 B2 | 3/2015 | Pai et al. |
| 9,269,760 B2 | 2/2016 | Pai et al. |
| 9,305,995 B1 | 4/2016 | Sun |
| 9,455,259 B2 | 9/2016 | Lim et al. |
| 9,614,025 B2 | 4/2017 | Pai et al. |
| 9,887,204 B2 | 2/2018 | Karda et al. |
| 10,163,917 B2 | 12/2018 | Ramaswamy |
| 2003/0008456 A1 | 1/2003 | Kim et al. |
| 2003/0141533 A1 | 7/2003 | Nakamura et al. |
| 2004/0004880 A1 | 1/2004 | Yoon et al. |
| 2004/0173836 A1 | 9/2004 | Oh et al. |
| 2005/0026361 A1* | 2/2005 | Graettinger ............ H01L 28/91 257/E21.648 |
| 2005/0051824 A1 | 3/2005 | Iizuka et al. |
| 2005/0086780 A1 | 4/2005 | Shao et al. |
| 2006/0086962 A1 | 4/2006 | Wu |
| 2006/0163639 A1 | 7/2006 | Ogawa |
| 2007/0090461 A1 | 4/2007 | Eliason et al. |
| 2007/0114588 A1 | 5/2007 | Shibata |
| 2008/0029801 A1* | 2/2008 | Nakamura ............ H01L 28/91 257/E21.409 |
| 2011/0102968 A1 | 5/2011 | Choi et al. |
| 2011/0284991 A1* | 11/2011 | Hijioka ............... H01L 23/5223 257/532 |
| 2011/0315526 A1 | 12/2011 | Jahnes et al. |
| 2013/0077379 A1 | 3/2013 | Matsudaira et al. |
| 2013/0119514 A1* | 5/2013 | Hirota .................... H01L 28/40 257/532 |
| 2013/0292794 A1 | 11/2013 | Pai et al. |
| 2014/0120689 A1 | 5/2014 | Pai et al. |
| 2014/0264749 A1 | 9/2014 | Pai et al. |
| 2015/0140774 A1 | 5/2015 | Pai et al. |
| 2016/0064391 A1 | 3/2016 | Li et al. |
| 2016/0172435 A1 | 6/2016 | Pai et al. |
| 2016/0351577 A1* | 12/2016 | Sun .................. H01L 27/11507 |
| 2017/0025552 A1 | 1/2017 | Schmids et al. |
| 2017/0069932 A1 | 3/2017 | Sweeney et al. |
| 2017/0084681 A1* | 3/2017 | Basker .................... H01L 28/60 |
| 2017/0236828 A1 | 8/2017 | Karda et al. |
| 2018/0122816 A1 | 5/2018 | Ramaswamy |

FOREIGN PATENT DOCUMENTS

| | | |
|---|---|---|
| JP | 2002-313954 | 10/2002 |
| JP | 2006-203128 | 8/2006 |
| KR | 10-1998-0027519 | 7/1998 |
| TW | 201322514 | 6/2013 |
| TW | 107143575 | 10/2019 |
| WO | WO PCT/US2018/062811 | 3/2019 |
| WO | WO PCT/US2018/062811 | 6/2020 |

\* cited by examiner

METHODS OF INCORPORATING LEAKER DEVICES INTO CAPACITOR CONFIGURATIONS TO REDUCE CELL DISTURB, AND CAPACITOR CONFIGURATIONS INCORPORATING LEAKER DEVICES

RELATED PATENT DATA

This patent resulted from a divisional of U.S. patent application Ser. No. 15/843,278, filed Dec. 15, 2017, which is hereby incorporated by reference herein.

TECHNICAL FIELD

Methods of incorporating leaker devices into capacitor configurations to reduce cell disturb, and capacitor configurations incorporating leaker devices.

BACKGROUND

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Leakage within memory cells can be problematic for at least the reasons that such may make it difficult to reliability store data, and may otherwise waste power. Leakage may be become increasingly difficult to control as circuitry is scaled to increasingly smaller dimensions.

It would be desirable to develop architectures which alleviate, or even prevent, undesired leakage; and to develop methods for fabricating such architectures.

DETAILED DESCRIPTION OF THE ILLUSTRATED EMBODIMENTS

Some embodiments include utilization of leaker devices to reduce charge buildup along bottom electrodes of capacitors. The leaker devices may couple the bottom electrodes to conductive plates. The conductive plates may be along top electrodes of the capacitors, and may be utilized to electrically couple the top electrodes to one another. The leaker devices may have conductivity (or alternatively, resistance) tailored to enable excess charge to drain from the bottom electrodes to the conductive plate, while not enabling problematic shorting between the bottom electrodes and the conductive plate.

Many, if not most, primary memory cell disturb mechanisms are due to a buildup of potential at cell bottom (CB) electrode nodes. As discussed in more detail below, this disturb mechanism is applicable for ferroelectric RAM (FERAM). However, other types of electronic devices may benefit from the disclosed subject matter as well.

In an embodiment, each of the memory cells in a memory array can be programmed to one of two data states to represent a binary value of "0" or "1" in a single bit. Such a cell is sometimes called a single-level cell (SLC). Various operations on these types of cells are independently known in the semiconductor and related arts.

Regardless of the memory cell arrangement, the primary disturb mechanisms discussed above can arise due to different factors. For example, charge on the cell bottom-node can rise due to factors such as plate glitch, access transistor leakage, cell-to-cell interactions, and/or other factors. If a dielectric material in a memory cell leaks significantly, the state of the cell may be adversely affected.

In various embodiments described herein, leaker devices are introduced into a memory array to prevent build-up of potential at bottom nodes of capacitors associated with individual memory cells. Example embodiments are described with reference to FIGS. 1-21.

FIGS. 1-9 are utilized to describe a first method for incorporating leaker devices into an array of capacitors.

Figure 1:
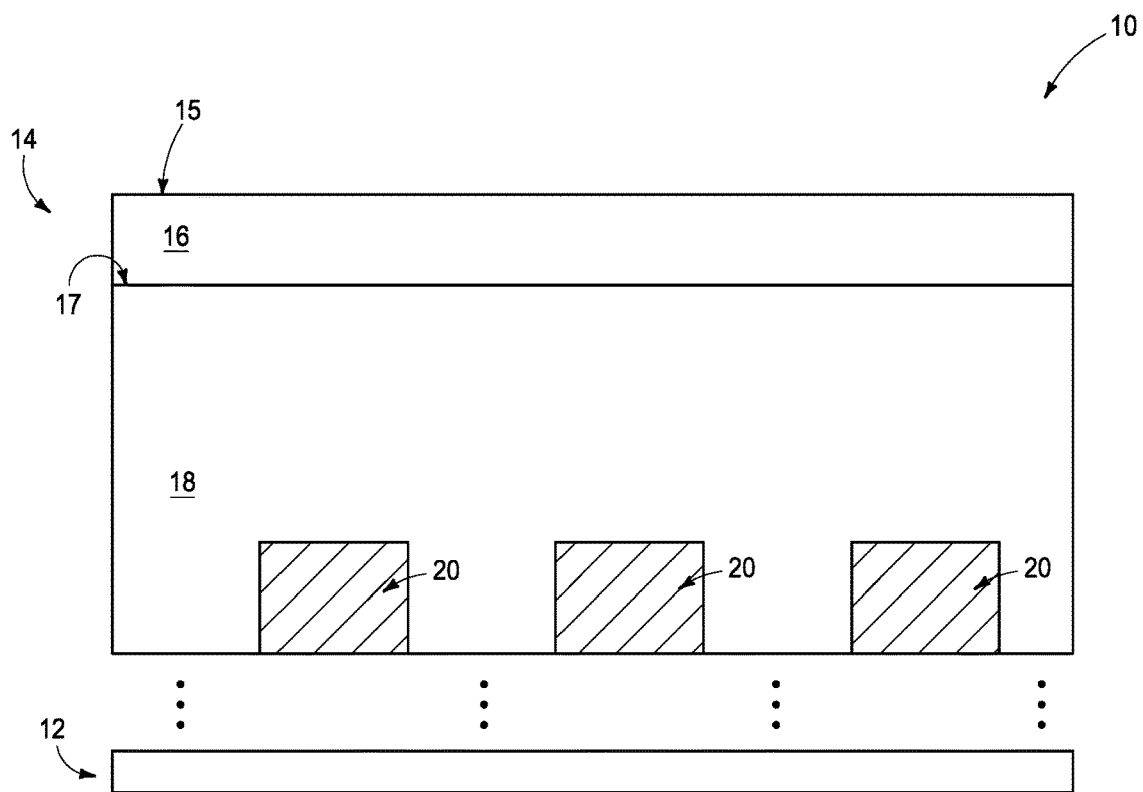
FIGS. 1-9 are diagrammatic cross-sectional views of an example assembly at example process stages of an example method for fabricating example capacitors.

Referring to FIG. 1, an assembly (i.e. apparatus, construction, etc.) 10 comprises a structure 14 over a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the structure 14 to indicate that there may be additional materials, components, etc., provided between the base 12 and the structure 14.

The structure 14 is shown to comprise a first material 16 over a second material 18, with the first and second materials being directly adjacent one another along an interface 17. The first material may be selectively etchable relative to the second material. For instance, in some embodiments the first material 16 may comprise, consist essentially of, or consist of silicon nitride; and the second material 18 may comprise, consist essentially of, or consist of silicon dioxide.

The structure 14 has an upper surface 15 extending across an upper surface of the first material 16.

Conductive structures 20 are shown within a bottom region of the second material 18. The conductive structures 20 are conductive interconnects. Processing described herein forms capacitors (e.g., capacitors shown in FIG. 9), and the conductive structures 20 may be utilized to couple electrodes of such capacitors with additional circuitry (e.g., transistors).

The conductive structures 20 may comprise any suitable composition or combination of compositions; such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

Although the materials 16 and 18 are shown to be homogeneous in the illustrated embodiment, in other embodiments one or both of the materials 16 and 18 may be a heterogeneous combination of two or more compositions.

The material 16 may be formed to any suitable thickness, and in some embodiments may be formed to a thickness within a range of from about 100 angstroms (Å) to about 500 Å.

The structure 14 may be referred to as a "supporting structure" in that the structure may ultimately support capacitors formed therein.

Figure 2:
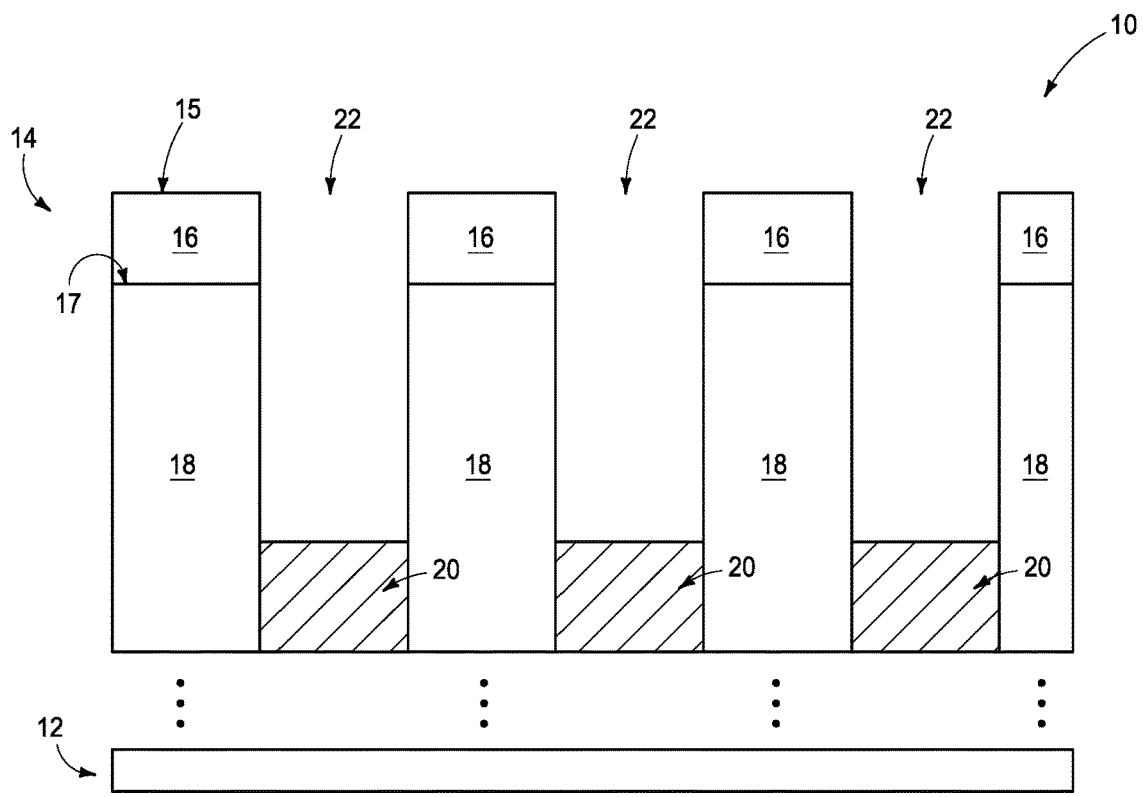

Referring to FIG. 2, openings 22 are formed in the supporting structure 14. The openings 22 extend through materials 16 and 18, and expose upper surfaces of the conductive structures 20. The openings 22 may be formed with any suitable processing. For instance, a patterned mask (not shown) may be provided over supporting structure 14 and utilized to define locations of openings 22, and then the openings 22 may be extended into the supporting structure 14 with one or more suitable etches. Subsequently, the patterned mask may be removed to leave the assembly of FIG. 2.

Figure 3:
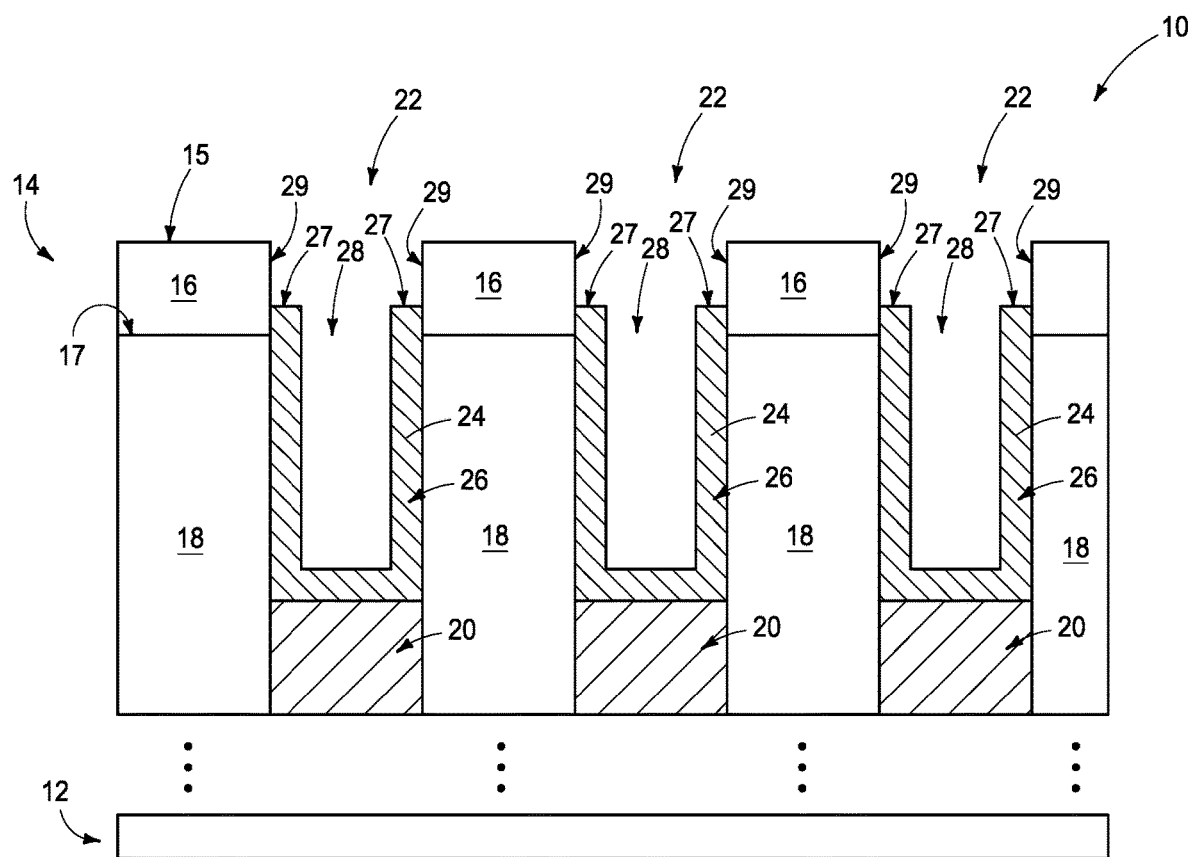

Referring to FIG. 3, the openings 22 are lined with electrode material 24 (which may be referred to as bottom electrode material). The electrode material 24 may comprise any suitable composition or combination of combinations; such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode material 24 may comprise, consist essentially of, or consist of titanium nitride.

The electrode material 24 is configured as upwardly-opening container-shaped bottom electrodes 26 within each opening. Each of the bottom electrodes has an upper surface 27 which is recessed to below the upper surface 15 of the supporting structure 14.

Each of the openings 22 has an exposed vertically-extending surface 29 of the supporting structure 14 above the recessed upper surface 27 of the upwardly-opening container-shaped bottom electrode 26 contained therein. In the illustrated embodiment, the upper surfaces 27 of the bottom electrodes 26 extend to above the interface 17 between the first and second materials 16/18, and accordingly the vertically-extending surfaces 29 comprise only the first material 16.

Figure 3A:
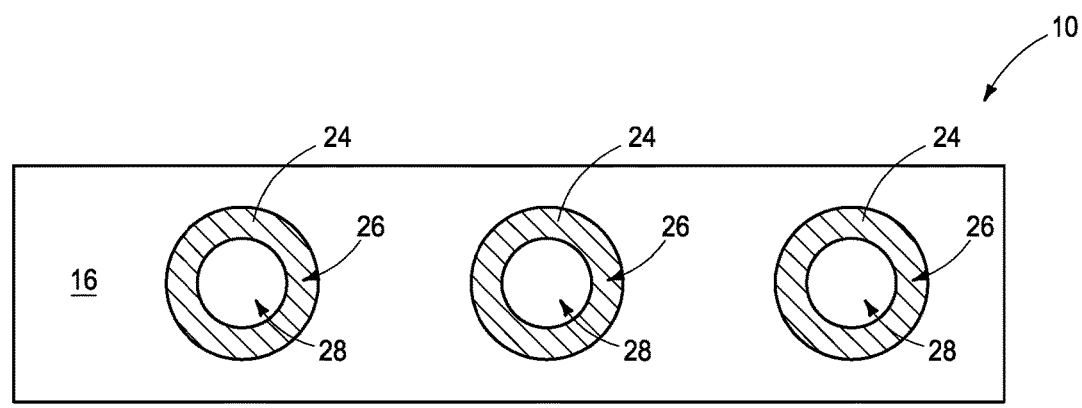
FIG. 3A is a top view of the assembly at the process stage of FIG. 3.

The container-shaped electrodes 26 have interior regions 28 extending therein. The electrodes 26 may have any suitable shape when viewed from above, and accordingly the interior regions 28 may have any suitable shape. For instance, FIG. 3A shows a top view of assembly 10 at the processing stage of FIG. 3 in an example application in which the bottom electrodes 26 are circular-shaped, and contain circular-shaped interior regions 28. In other embodiments, the bottom electrodes 26 may have other shapes, including, for example, elliptical shapes, polygonal shapes, etc.

The bottom electrodes 26 may be formed utilizing any suitable processing. For instance, in some embodiments the electrode material 24 may be initially formed to extend across the upper surface 15 of supporting structure 14, as well is within the openings 22. Subsequently, excess material 24 may be removed with one or more suitable etches to leave the remaining material 24 configured as the shown upwardly-opening container-shaped bottom electrodes 26.

The electrode material 24 may have any suitable thickness; and in some embodiments may have a thickness within a range of from about 10 Å to about 200 Å.

Figure 4:
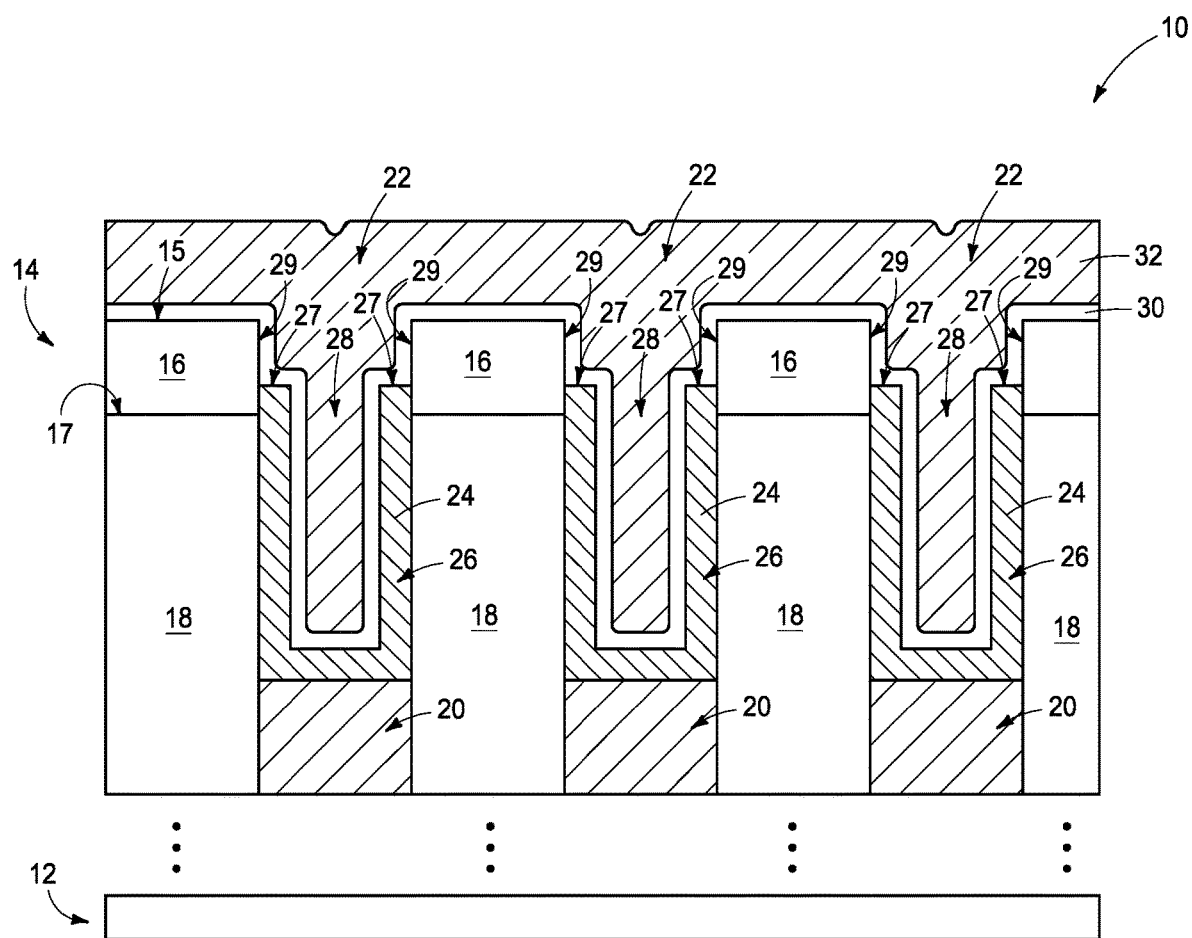

Referring to FIG. 4, the interior regions 28 of the bottom electrodes 26 are lined with insulative material 30. The insulative material 30 narrows the interior regions 28 of the upwardly-opening container-shaped bottom electrodes 26.

The insulative material 30 may be referred to as capacitor insulative material, as it is ultimately utilized in a capacitor configuration. At least some of the capacitor insulative material may comprise ferroelectric insulative material, and in some embodiments an entirety of the capacitor insulative material is ferroelectric insulative material.

The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

The insulative material 30 may be formed to any suitable thickness; and in some embodiments may have a thickness within a range of from about 30 Å to about 250 Å.

Upper electrode material 32 is formed over the insulative material 30, and within the narrowed interior regions 28 extending into the container-shaped bottom electrodes 26.

The upper electrode material 32 may comprise any suitable composition or combination of compositions; such as, for example, one or more of various metals (e.g., titanium, tungsten, ruthenium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode material 32 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

The electrode material 32 may have any suitable thickness, and in some embodiments may have a thickness within a range of from about 10 Å to about 200 Å.

The electrode materials 24 and 32 may comprise a same composition as one another in some embodiments, or may comprise different compositions relative to one another. In some embodiments, the electrode materials 24 and 32 may both comprise, consist essentially of, or consist of titanium nitride.

Figure 5:
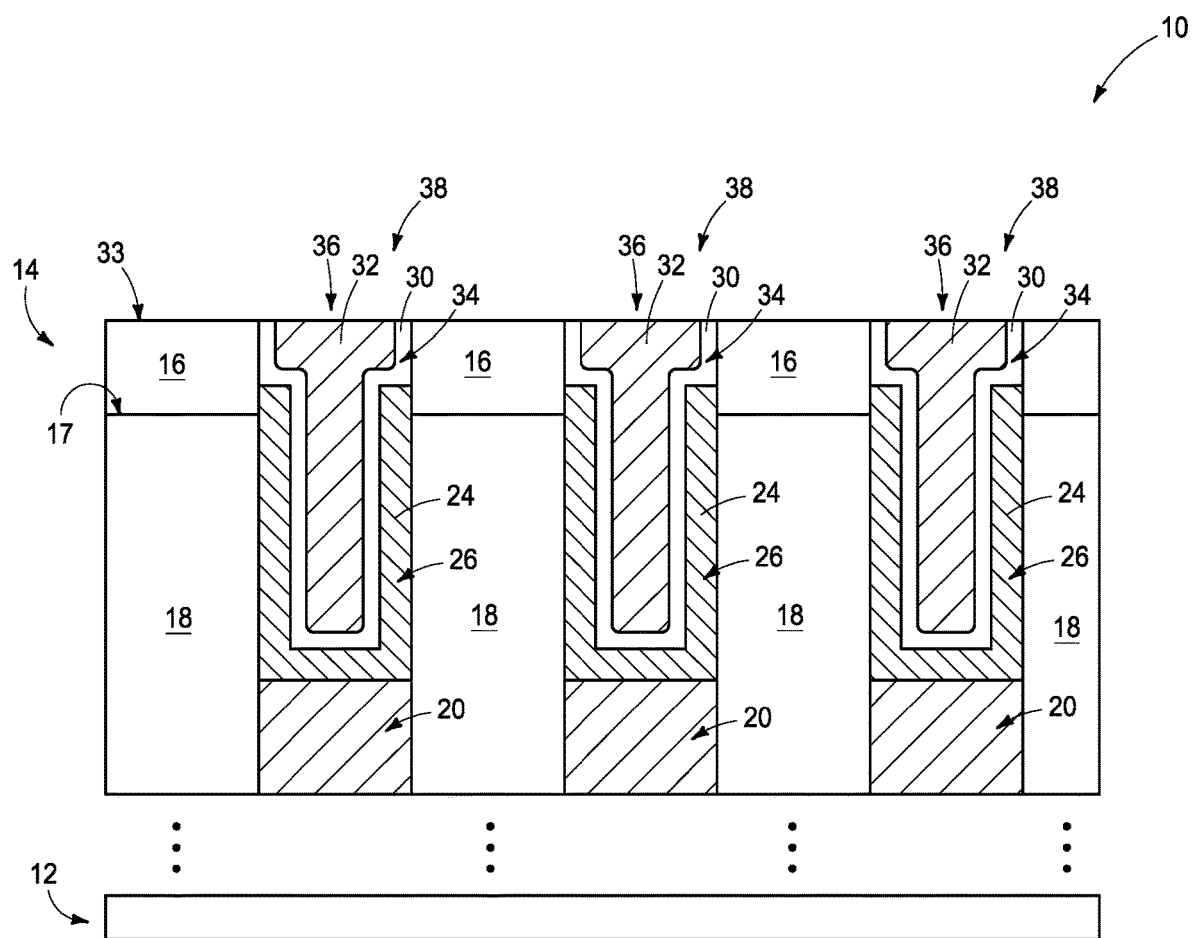

Referring to FIG. 5, the assembly 10 is subjected to planarization (for instance, chemical-mechanical polishing) to form the planarized upper surface 33. The planarization patterns electrode material 32 into the upper electrodes 36, and patterns the insulative material 30 into upwardly-opening container-shaped insulative structures 34. The electrodes 26 and 36, together with the insulative material 30 between them, form a plurality of capacitors 38. The capacitors 38 may be ferroelectric capacitors in some embodiments.

Figure 6:
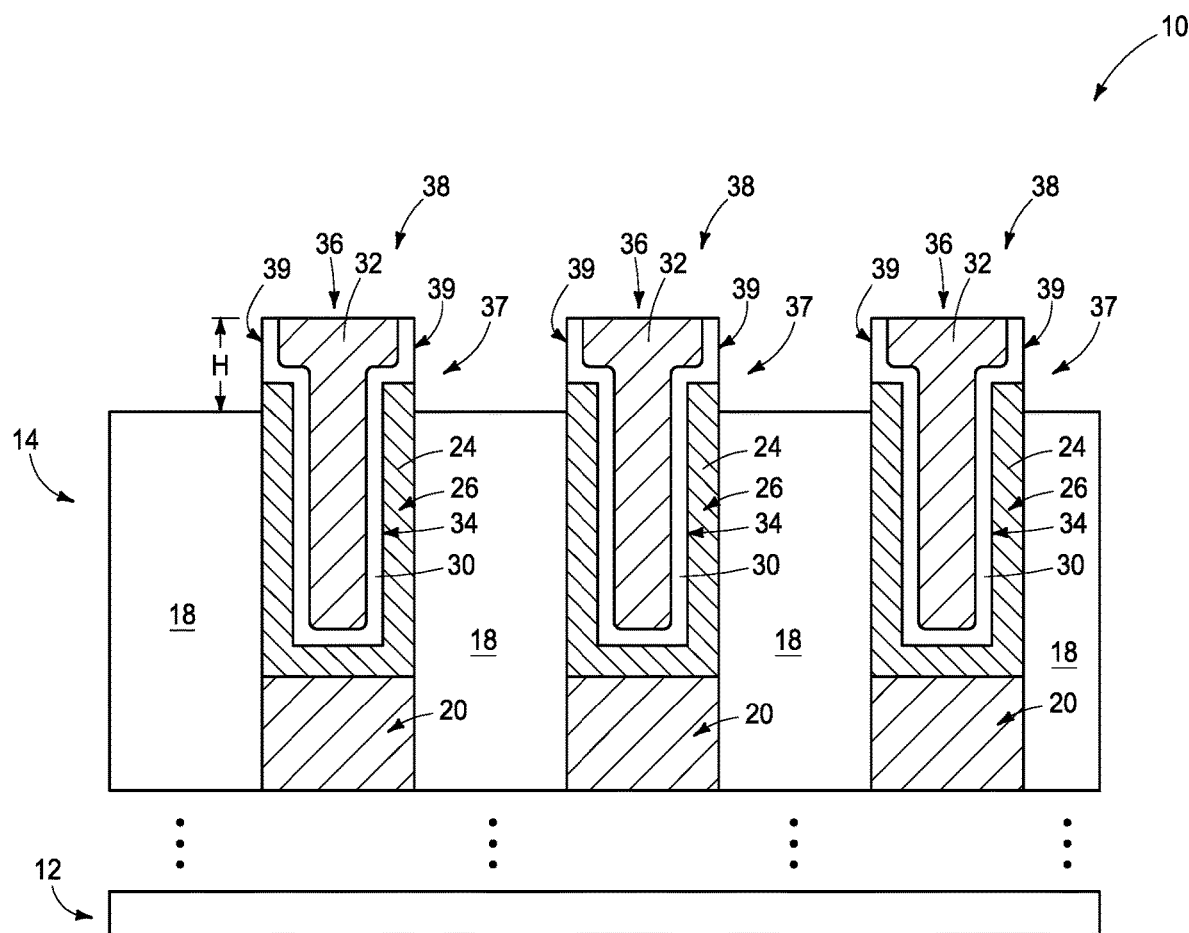

Referring to FIG. 6, the first material 16 (FIG. 5) is removed to expose upper sidewall regions 39 of the capacitors 38. The upper sidewall regions 39 may be considered to be along exposed parts 37 of the capacitors 38.

The exposed upper sidewall regions 39 include portions (i.e., segments) of the bottom electrodes 26 under portions (i.e., segments) of the insulative material 30. In some embodiments, the exposed upper sidewall regions 39 may have heights H within a range of from about 100 Å to about 500 Å.

Figure 7:
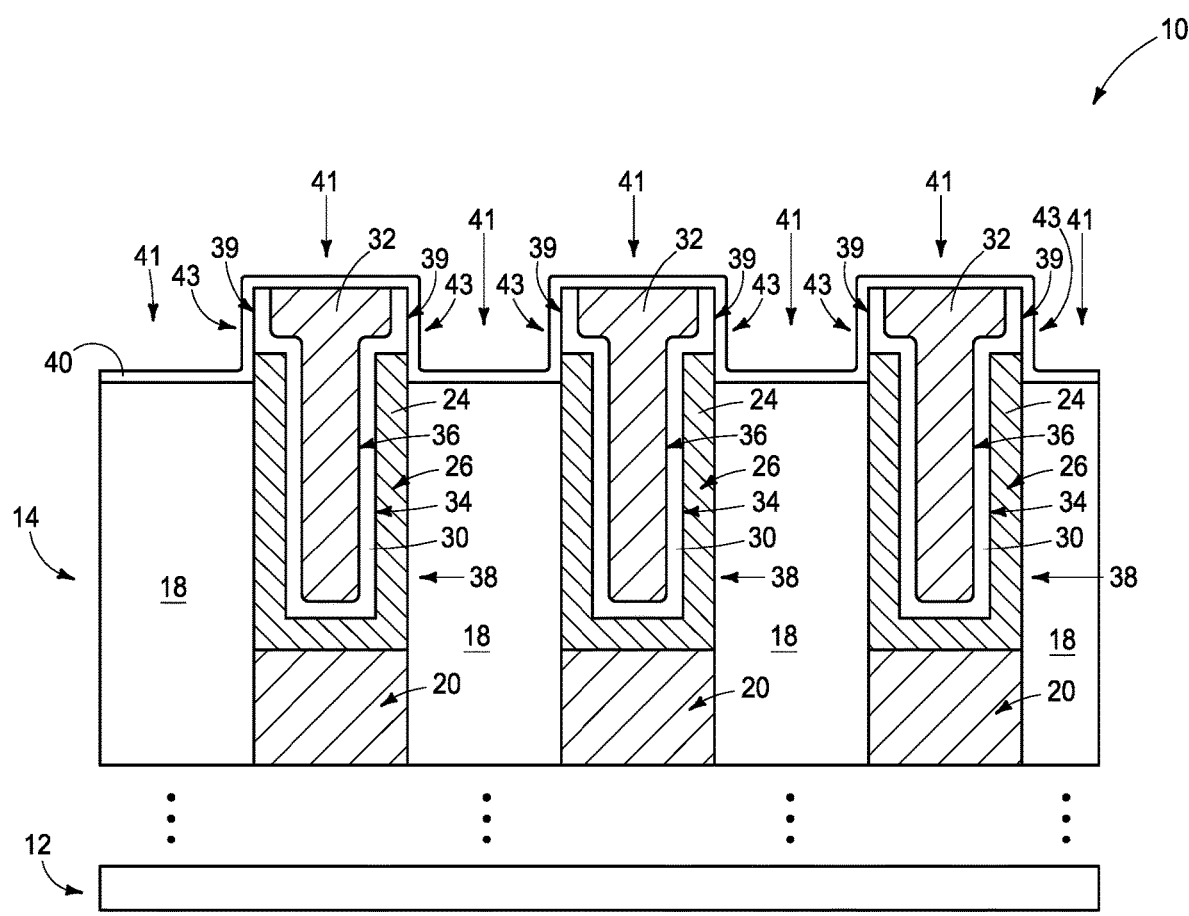

Referring to FIG. 7, leaker device material 40 is formed across an upper surface of assembly 10, with the leaker device material 40 extending along the upper surfaces of the capacitors 38, along an upper surface of the material 18, and along the upper sidewall regions 39 of the capacitors 38.

The leaker device material may comprise any suitable composition or combination of compositions. In some embodiments, the leaker device material 40 may comprise, consist essentially of, or consist of one or more of titanium, nickel and niobium in combination with one or more of germanium, silicon, oxygen, nitrogen and carbon. In some embodiments, the leaker device material may comprise, consist essentially of, or consist of one or more of Si, Ge, SiN, TiSiN, TiO, TiN, NiO, NiON and TiON; where the chemical formulas indicate primary constituents rather than particular stoichiometries. In some embodiments, the leaker device material may comprise, consist essentially of, or consist of titanium, oxygen and nitrogen. In some embodiments, the leaker device material may comprise amorphous silicon, niobium monoxide, silicon-rich silicon nitride, etc.; either alone or in any suitable combination.

In some embodiments, the leaker device material may be a continuous layer having a thickness within a range of from about 2 Å to about 20 Å. In some embodiments, the leaker device material may be a continuous layer having a thickness within a range of from about 6 Å to about 15 Å. Is noted that the thickness of the leaker device material 40 corresponds to a vertical thickness along horizontally-extending segments 41 of the leaker device material, and corresponds to a horizontal thickness along vertically-extending segments 43 of the leaker device material.

Figure 8:
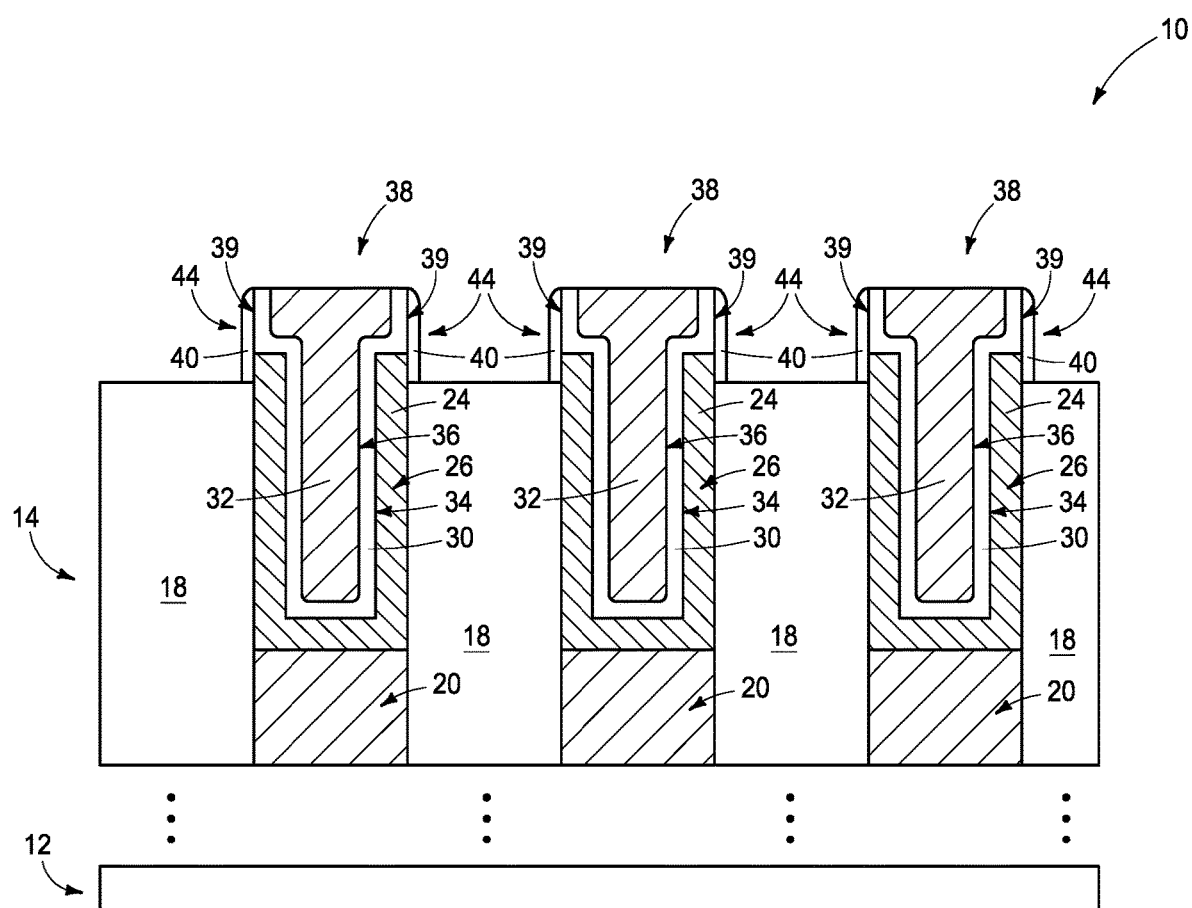

Referring to FIG. 8, the leaker device material 40 is patterned into vertically-extending leaker devices 44 with a spacer (i.e., anisotropic) etch. The leaker devices 44 are electrically coupled with the bottom electrodes 26, and in the shown embodiment directly contact the bottom electrodes 26. Each of the leaker devices 44 extends along a segment of the bottom electrode material 24, and along a segment of the insulative material 30 associated with the upper sidewall regions 39 of the capacitors 38.

Figure 9:
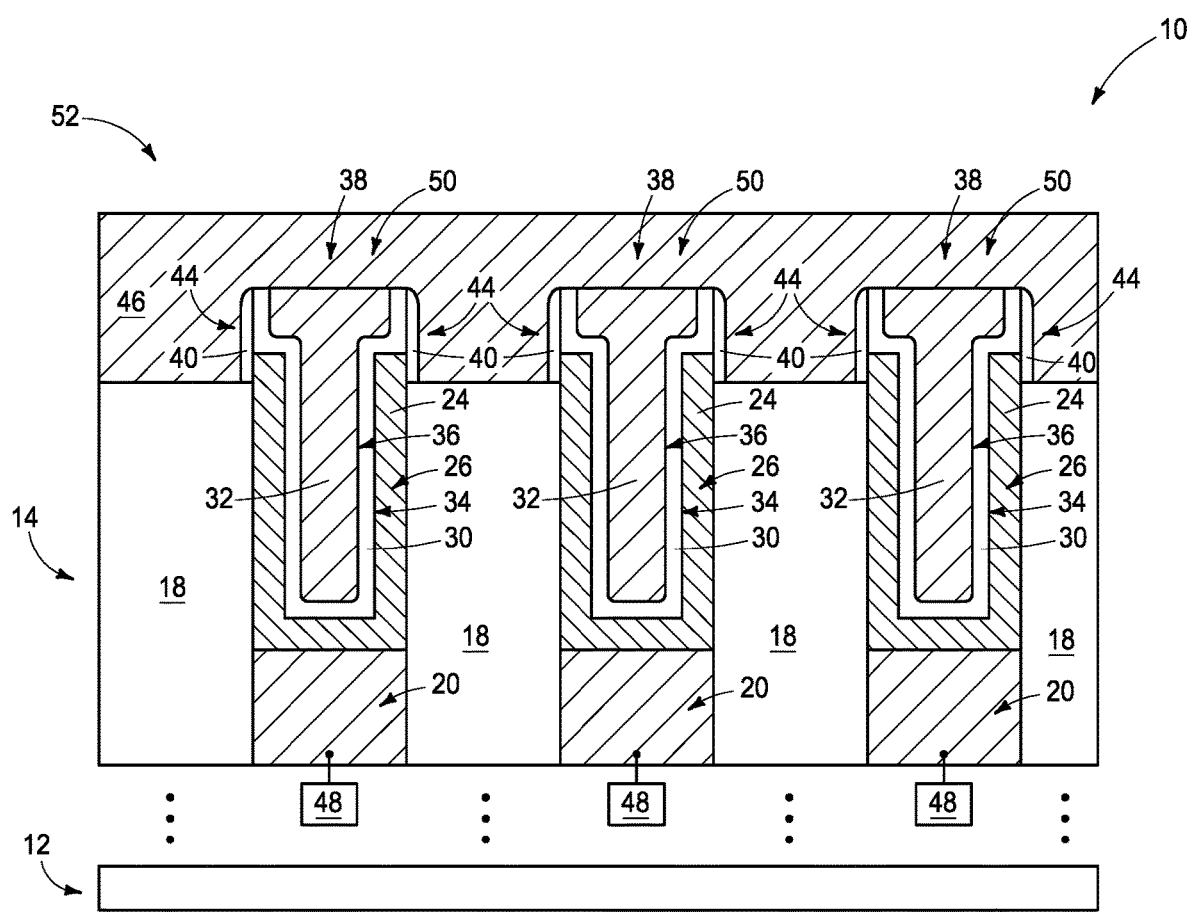

Referring to FIG. 9, plate material 46 is formed to extend across the upper electrodes 36 of the capacitors 38, and to electrically couple the upper electrodes to one another. The plate material 46 is directly against the top electrodes 36 of the capacitors 38, and directly against the vertically-extending leaker devices 44.

The plate material 46 may comprise any suitable electrically conductive materials, such as, for example, one or more of various metals (e.g., titanium, tungsten, cobalt, nickel, ruthenium, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The plate material 46 may comprise a different composition than the top electrodes 36. For instance, in some embodiments the top electrodes 36 may comprise, consist essentially of, or consist of TiSiN and/or TiN (where the chemical formulas list primary compositions rather than specific stoichiometries), and the plate material 46 may comprise, consist essentially of, or consist of tungsten.

The leaker devices 44 electrically couple the bottom electrodes 26 of the capacitors 38 with the plate material 46 to enable discharge of at least a portion of any excess charge from the bottom electrodes 26 to the plate material 46. In some embodiments, electrical resistance of the leaker devices 44 is tailored so that the leaker devices 44 have appropriate conductivity to remove excess charge from the bottom electrodes 26 while having low enough conductivity (e.g., high enough resistance) so that the leaker devices 44 do not undesirably electrically short the bottom electrodes 26 to the plate material 46.

In some embodiments, the capacitors 38 may be incorporated into memory cells 50 (such as, for example, ferroelectric memory cells) by coupling the capacitors with appropriate circuit components. For instance, transistors 48 are diagrammatically illustrated in FIG. 9 as being coupled to the bottom electrodes 26 through the conductive interconnects 20. The transistors 48, and/or other suitable components, may be fabricated at any suitable process stage. For instance, in some embodiments the transistors 48 may be fabricated at a processing stage prior to the illustrated process stage of FIG. 1.

The memory cells 50 may be part of a memory array; such as, for example, an FeRAM (Ferroelectric Random Access Memory) array.

In some embodiments, the leaker devices 44 may be considered to be resistive interconnects coupling bottom electrodes 26 within memory cells 50 to the conductive plate material 46. If the leaker devices are too leaky, then one or more memory cells may experience cell-to-cell disturb. If the leaker devices 44 are not leaky (conductive) enough, then excess charge from the bottom electrodes 26 will not be drained. Persons of ordinary skill in the art will recognize how to calculate the resistance needed for the leaker devices 44 for a given memory array. In some embodiments, the leaker devices 44 may have resistance within a range of from about 0.1 megaohms to about 5 megaohms. Factors such as separation between adjacent memory cells, the dielectric material used between the memory cells, physical dimensions of the memory cells, the amount of charge placed in the memory cells, a size of the memory array, a frequency of operations conducted by the memory array, etc., may be considered when making a determination of the resistance appropriate for the leaker devices 44.

Figure 10:
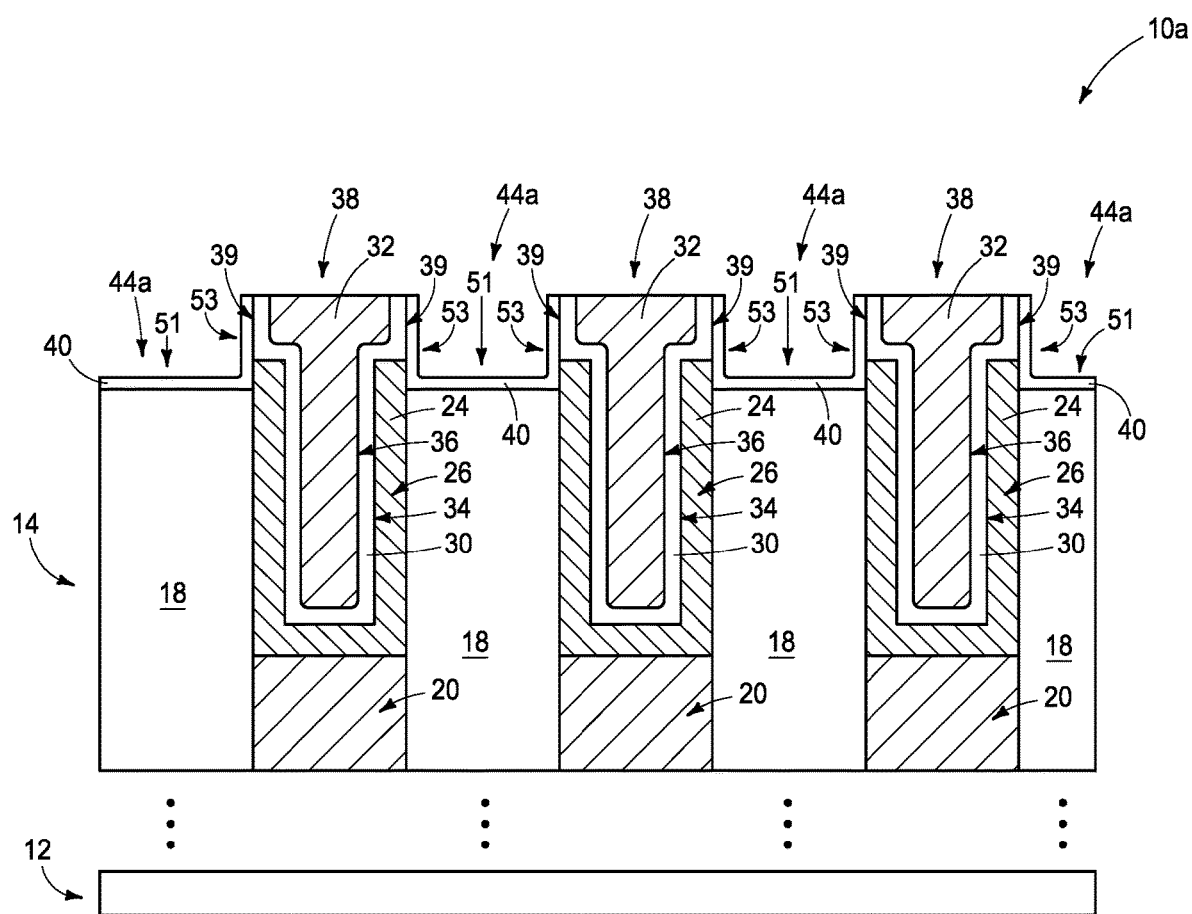
FIGS. 10 and 11 are diagrammatic cross-sectional views of an example assembly at example process stages of an example method for fabricating example capacitors. The process stage of FIG. 10 may follow that of FIG. 6 in some embodiments.
Figure 11:
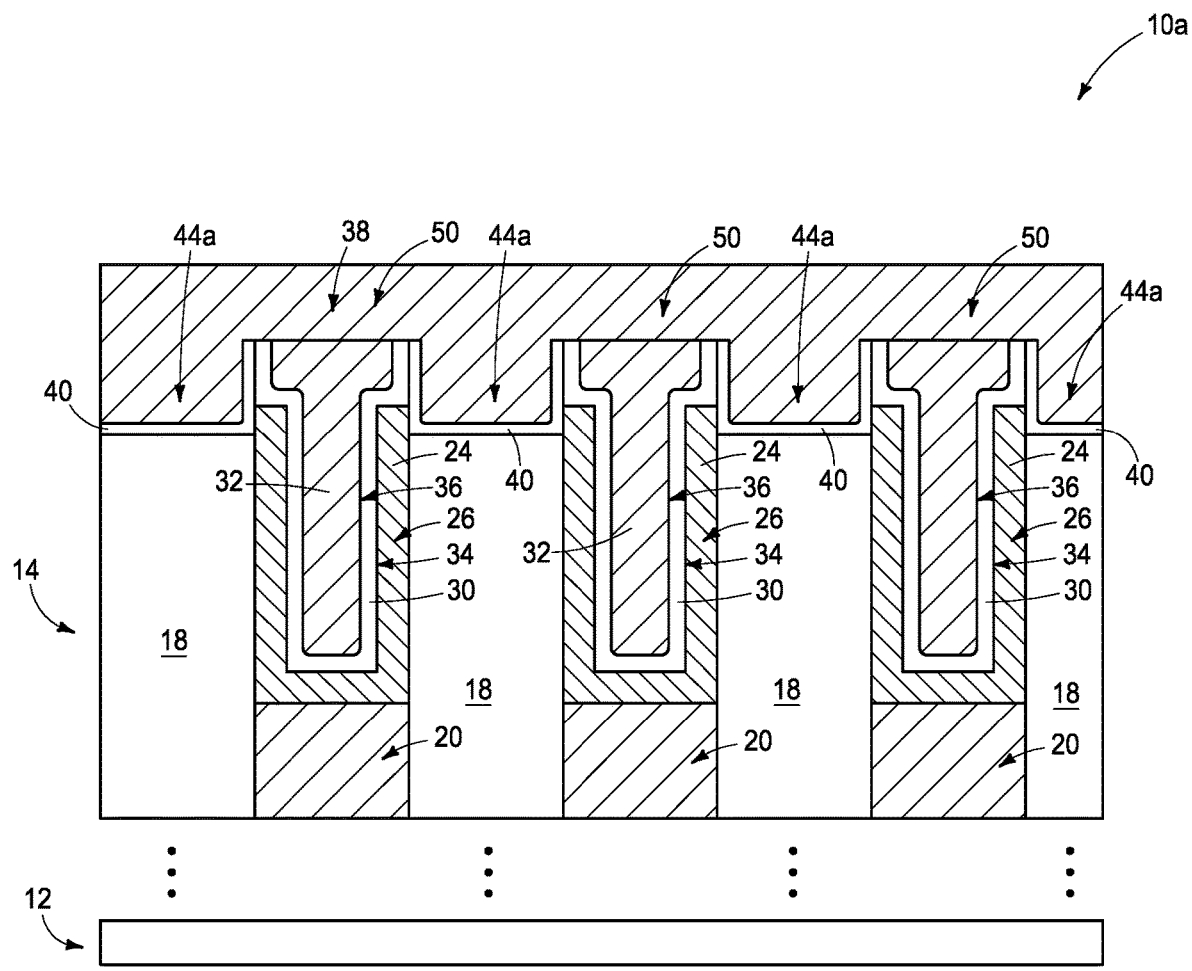

The embodiment of FIGS. 8 and 9 shows the leaker devices 44 as comprising only the vertically-extending segments along the upper sidewall regions 39 of the capacitors 38. In other embodiments, the leaker devices 44 may have other configurations. For instance, FIG. 10 shows an assembly 10a at a process stage alternative to that of FIG. 8, and which may follow that of FIG. 7. The assembly 10a comprises leaker device material 40 configured as leaker devices 44a, with each of such leaker device structures comprising a horizontal segment 51 along an upper surface of material 18, and vertical segments 53 along the upper sidewall regions 39 of the capacitors 38. FIG. 11 shows the leaker devices 44a incorporated into memory cells 50 analogous to the memory cells described above with reference to FIG. 9.

Another example process for incorporating leaker devices into memory cells is described with reference to FIGS. 12-16.

Figure 12:
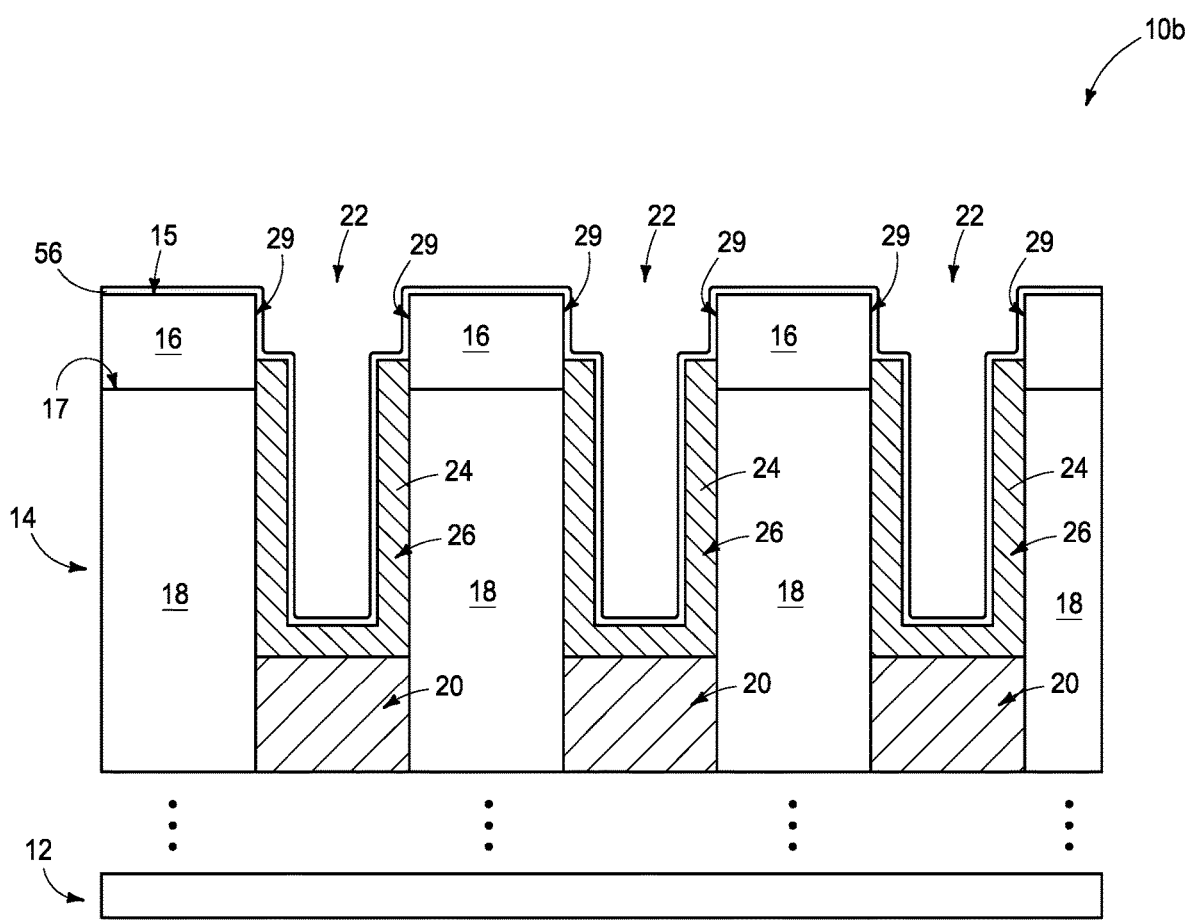
FIGS. 12-16 are diagrammatic cross-sectional views of an example assembly at example process stages of an example method for fabricating example capacitors. The process stage of FIG. 12 may follow that of FIG. 3 in some embodiments.

Referring to FIG. 12, an assembly 10b is shown at a process stage which may follow the process stage of FIG. 3. The assembly 10b includes the supporting structure 14 having openings 22 extending therein, and includes the upwardly-opening container-shaped bottom electrodes 26 within the bottoms of the openings 22. A material 56 is deposited over the upper surface 15 of the supporting structure 14, and within the openings 22. The material 56 extends along the vertically-extending surfaces 29 of the supporting structure within openings 22. The material 56 is a precursor which is ultimately converted into leaker device material; and may comprise any composition suitable for being converted into a desired leaker device material. In some embodiments, the material 56 may be referred to as a first composition. In some embodiments, such first composition may comprise, consist essentially of, or consist of titanium nitride.

Figure 13:
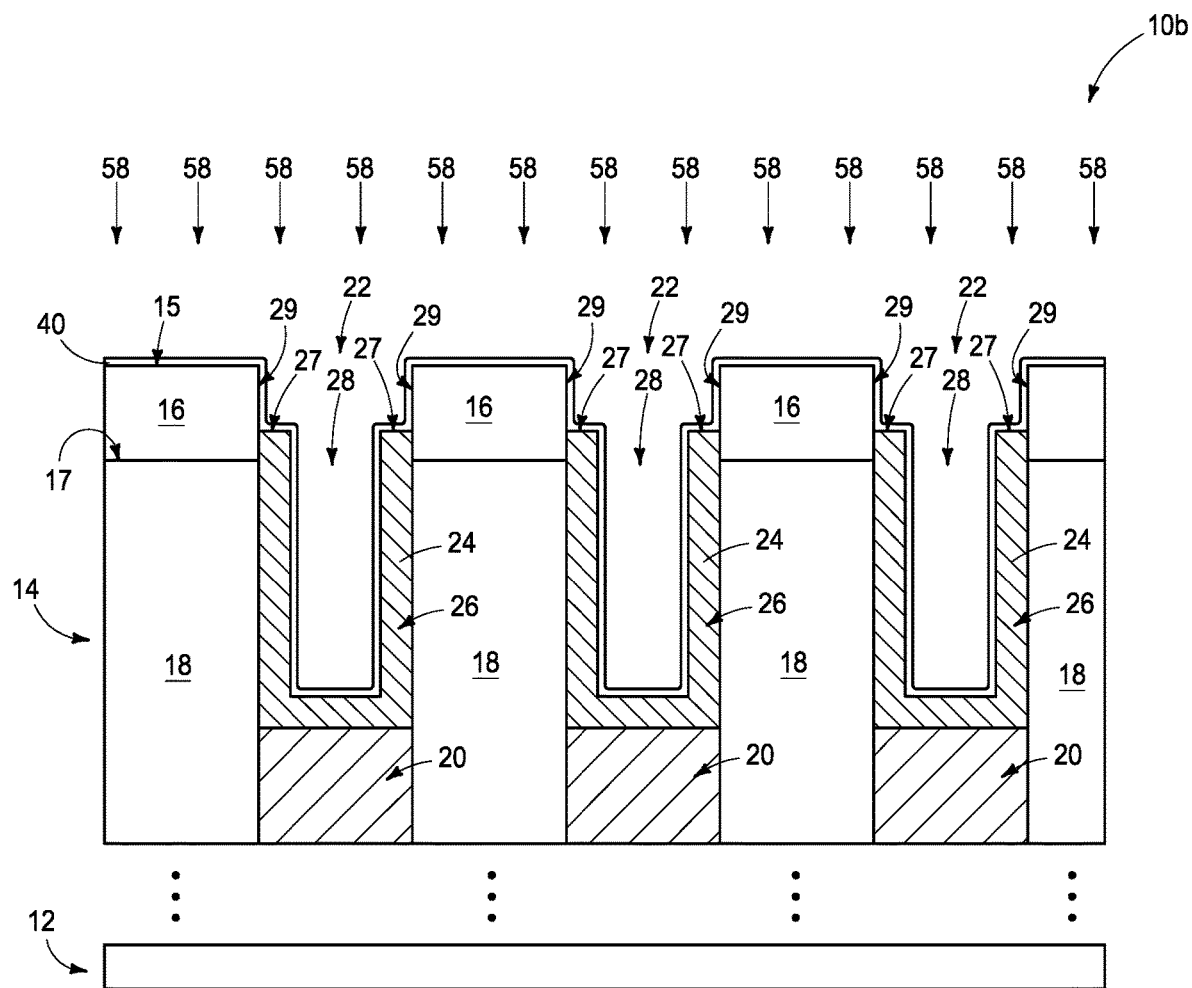

Referring to FIG. 13, the first composition 56 (FIG. 12) is chemically modified to convert the first composition into a second composition corresponding to the leaker device material 40. In some embodiments, the chemical modification may comprise lowering conductivity within the first composition to thereby convert the first composition into the leaker device material 40. The chemical modification may utilize any suitable conditions. In the illustrated embodiment, the chemical modification comprises exposure of assembly 10b to an oxidant 58, and accordingly comprises oxidation of the material 56 (FIG. 12) to convert the material 56 into the leaker device material 40. The oxidant may be any suitable oxidant; including, for example, one or more of ozone, hydrogen peroxide, diatomic oxygen, etc. In some embodiments, the first composition 56 of FIG. 12 comprises, consists essentially of, or consists of titanium nitride; and the leaker device material 40 of FIG. 13 comprises, consists essentially of, or consists of TiON (where the chemical formula indicates primary constituents rather than a particular stoichiometry).

Although the illustrated embodiment of FIGS. 12 and 13 forms the leaker device material 40 utilizing a multi-step process in which the first composition 56 is deposited and thereafter converted to the leaker device material 40, in other embodiments the leaker device material 40 of FIG. 13 may be formed with a simple deposition of the leaker device material across the upper surface 15 of supporting structure 14 and within the openings 22. Regardless of the method utilized for formation of the leaker device material, the leaker device material 40 of FIG. 13 may comprise any of the compositions described above with reference to the leaker device material 40 of FIG. 7.

The leaker device material 40 of FIG. 13 extends within the interior regions 28 of the container-shaped bottom electrodes 26, and also extends along the sidewall surfaces 29 of the supporting structure 14 (with such sidewall surfaces 29 being within openings 22 and above the uppermost surfaces 27 of the bottom electrodes 26). The leaker device material 40 may be a continuous layer (as shown), or may be a discontinuous. In some embodiments, the leaker device material 40 is a continuous layer having a thickness within a range of from about 2 Å to about 20 Å. In some embodiments, the leaker device material 40 may be a continuous layer having a thickness within a range of from about 6 Å to about 15 Å.

Figure 14:
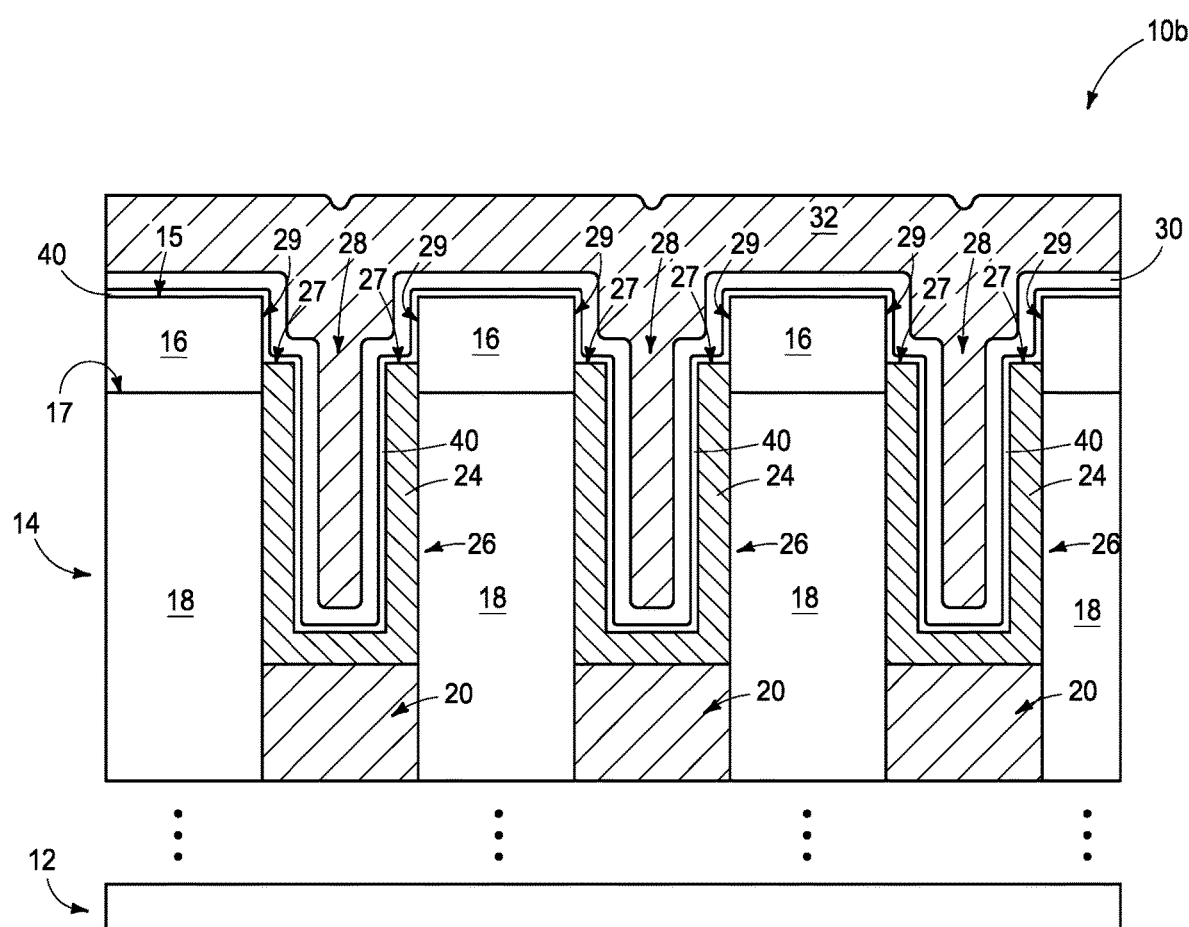

Referring to FIG. 14, insulative material 30 is formed over the leaker device material 40, and upper electrode material 32 is formed over the insulative material 30. The materials 30 and 32 may comprise the same compositions discussed above relative to FIG. 4. The insulative material 30 extends within the interior regions 28 of the upwardly-opening container-shaped bottom electrodes 26 and narrows such interior regions, and the upper electrode material 32 extends into the narrowed interior regions.

Figure 15:
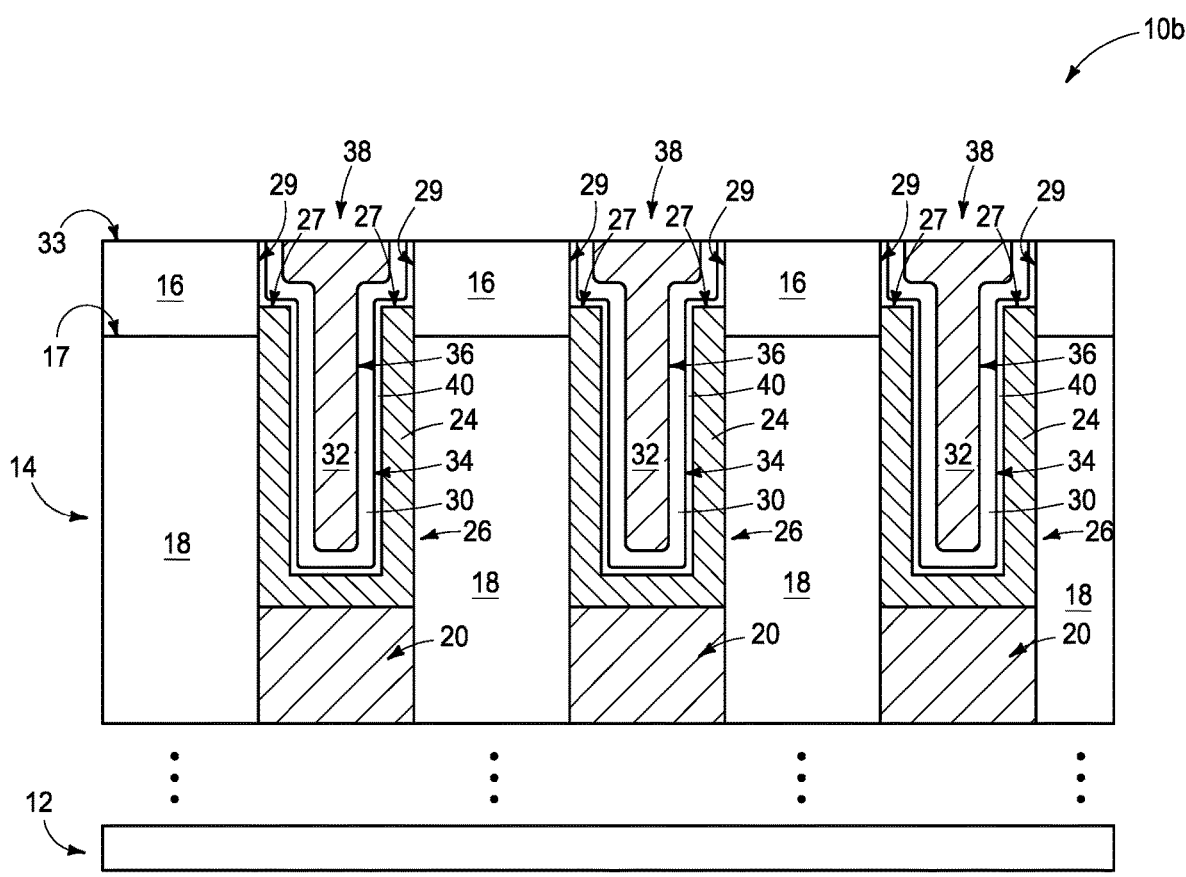

Referring to FIG. 15, the assembly 10b is subjected to planarization (i.e., polishing conditions); such as, for example, chemical-mechanical polishing. Such forms the planarized upper surface 33. The planarization patterns electrode material 32 into the upper electrodes 36, and patterns the insulative material 30 into the upwardly-opening container-shaped insulative structures 34. The electrodes 26 and 36, together with the materials 40 and 30 between them, form a plurality of capacitors 38. The capacitors 38 may be ferroelectric capacitors in some embodiments.

Figure 16:
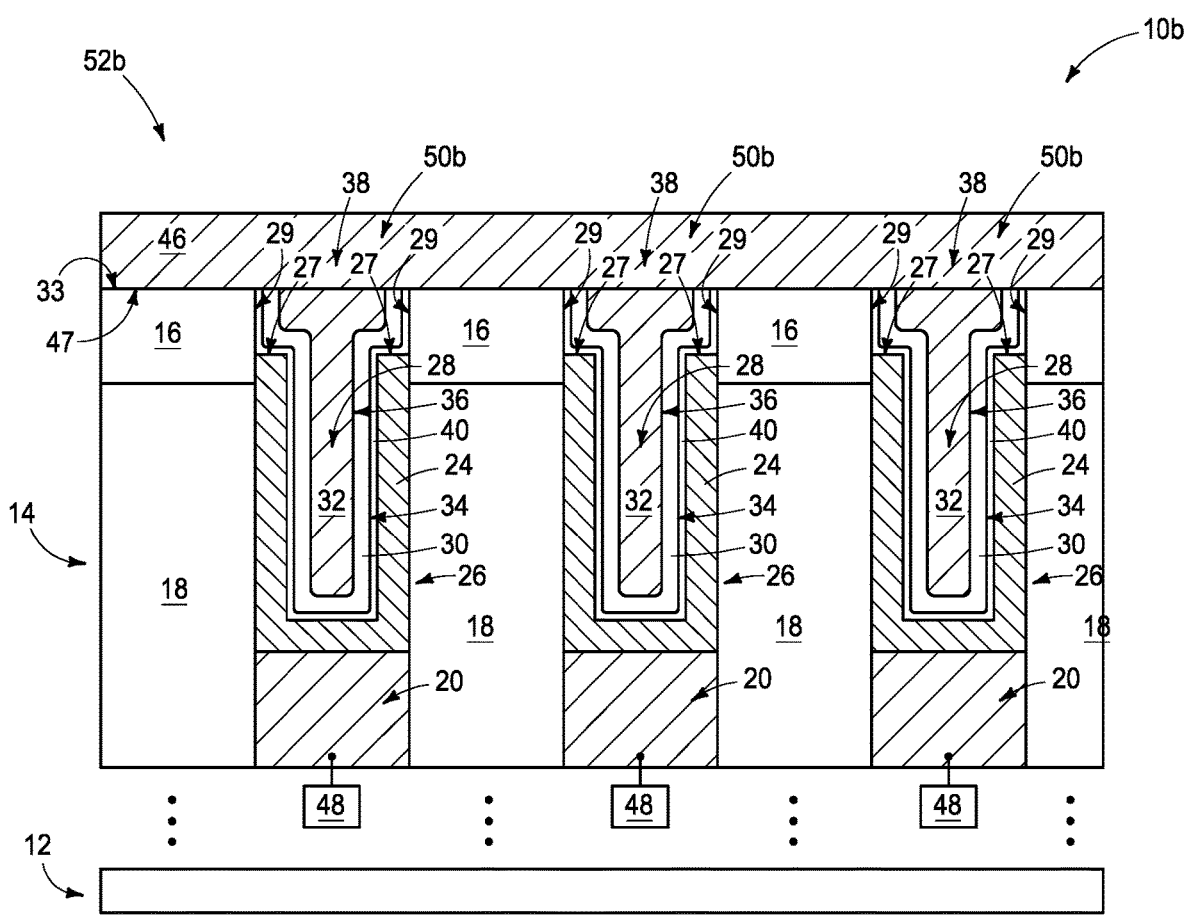

Referring to FIG. 16, the plate material 46 is formed to extend along the planarized upper surface 33. The plate material 46 electrically couples the upper electrodes 36 of the capacitors 38 to one another. The plate material 46 is directly against the leaker device material 40, and accordingly the leaker device material 40 may electrically couple the bottom electrodes 36 to the plate material 46. The leaker device material 40 of FIG. 16 may be configured to comprise appropriate compositions and dimensions to be configured to discharge at least a portion of excess charge from the bottom electrodes 26 to the plate material 46.

In some embodiments, the assembly 10b of FIG. 16 may be considered to comprise horizontally-spaced upwardly-opening container-shaped bottom electrodes 26 supported by the supporting structure 14. The supporting structure 14 has an upper surface 33 above upper surfaces 27 of the bottom electrodes. The vertically-extending surfaces 29 of the supporting structure extend from the upper surfaces 27 of the bottom electrodes to the upper surface 33 of the supporting structure, and to a bottom surface 47 of the plate material 46.

The leaker device material 40 extends along the vertically-extending surfaces 29 of the supporting structure 14, and also within interior regions 28 of the container-shaped bottom electrodes 26. In the illustrated embodiment, the leaker device material 40 lines the interior regions of the bottom electrodes 26 and is directly against the bottom electrodes.

The insulative material 30 is over the leaker device material 40, and within the interior regions 28 of the container-shaped bottom electrodes 26. The insulative material 30 is configured as the upwardly-opening container-shaped insulative structures 34.

The upper electrodes 36 extend into the container-shaped insulative structures 34.

The capacitors 38 comprises the electrodes 26 and 36, together with the insulative material 30 therebetween. In some embodiments, such capacitors may be ferroelectric capacitors. The capacitors 38 may be coupled with the transistors 48 through the interconnects 20 (as shown), and may be incorporated into memory cells 50b. Such memory cells may correspond to a plurality of substantially identical memory cells within a memory array 52b (with the term "substantially identical" meaning identical to within reasonable tolerances of fabrication and measurement). Although three memory cells 50b are shown, it is to be understood that the memory array may comprise any suitable number of memory cells 50b; and in some embodiments may comprise hundreds, thousands, millions, billions, etc. of substantially identical memory cells.

The plate material 46 extends across the upper electrodes 36 of capacitors 38, and couples the upper electrodes to one another. The plate material 46 is also directly against an upper surface of the leaker device material 40. The leaker device material may be configured to have appropriate conductivity so that such material will discharge at least a portion of excess charge from the bottom electrodes 26 to the plate material 46, without creating undesired electrical shorts between the bottom electrodes 26 and the plate material 46.

The illustrated embodiment of FIG. 13 has the upper surface 27 of the bottom electrodes 26 above the interface 17 between the first and second materials 16 and 18. Accordingly, the vertically-extending surfaces 29 are only along the first material 16. FIG. 13 shows an example of an embodiment in which the interface 17 between the first and second materials 16 and 18 is at or below the upper surfaces 27 of the bottom electrodes 26. In other embodiments, the interface 17 may be above the upper surfaces of the bottom electrodes as described with reference to FIGS. 17 and 18.

Figure 17:
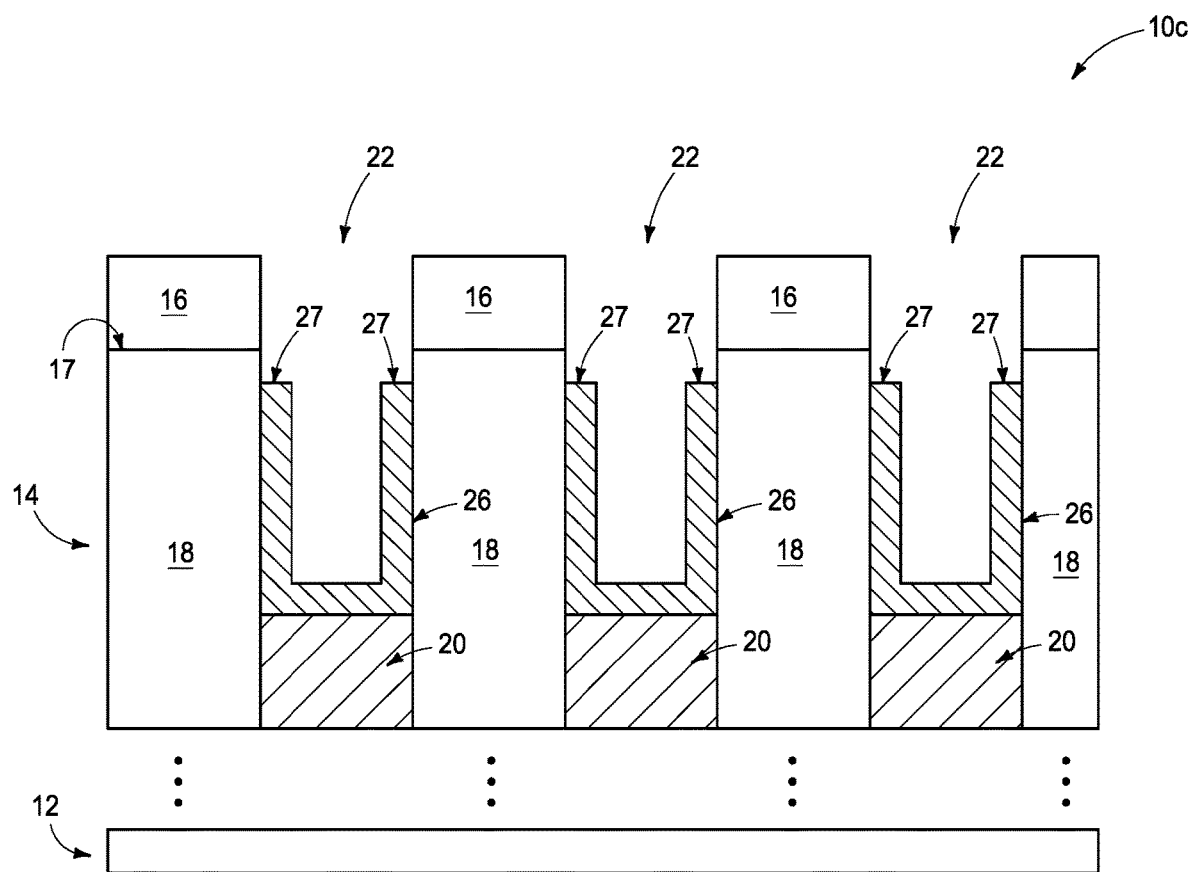
FIGS. 17 and 18 are diagrammatic cross-sectional views of an example assembly at example process stages of an example method for fabricating example capacitors. The process stage of FIG. 17 may follow that of FIG. 2 in some embodiments.

Referring to FIG. 17, an assembly 10c is shown at a process stage analogous to that described above with reference to FIG. 3. The embodiment of FIG. 17 differs from that of FIG. 3 in that that the bottom electrodes 26 of assembly 10c have upper surfaces 27 beneath the interface 17, while the bottom electrodes 26 shown in the assembly 10 of FIG. 3 have upper surfaces 27 above the interface 17.

Figure 18:
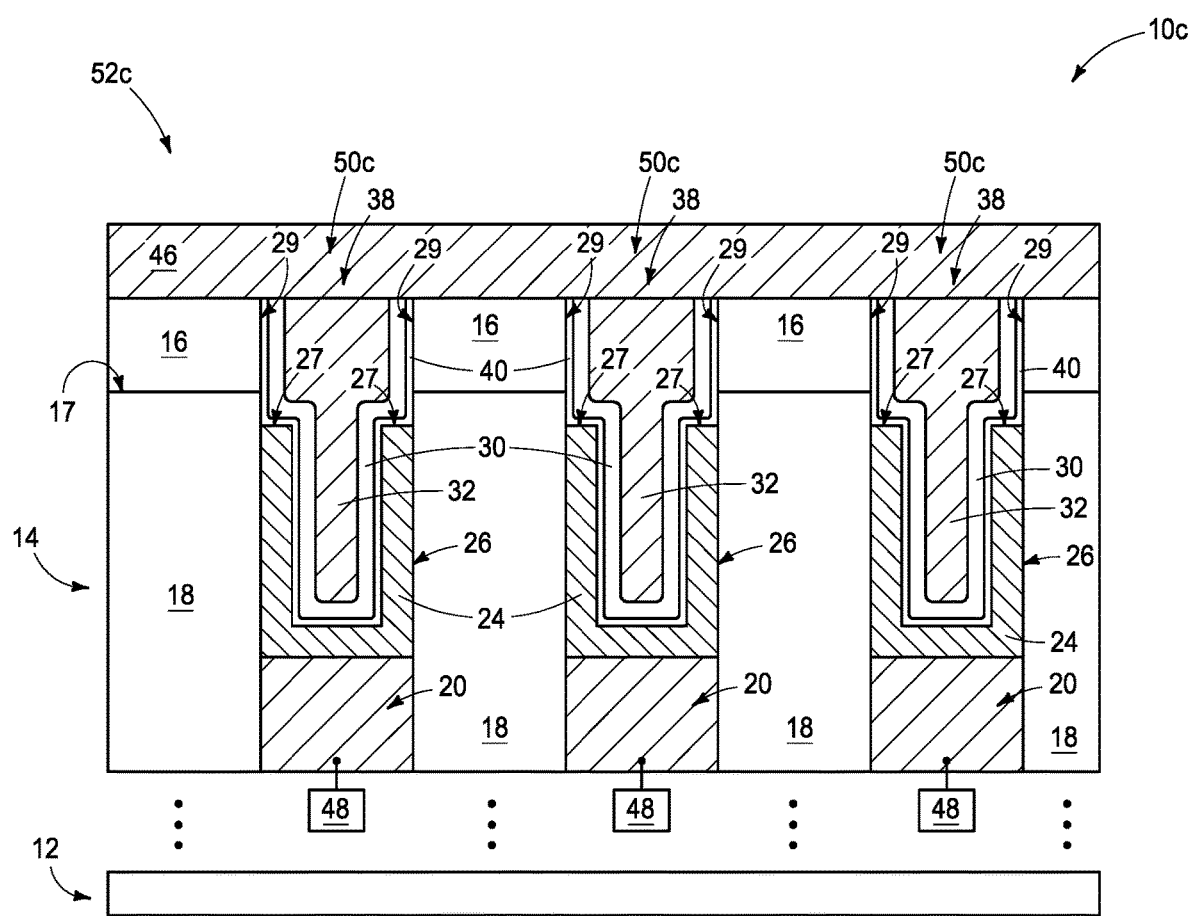

Referring to FIG. 18, the assembly 10c is shown at a processing stage analogous to that of FIG. 16. The assembly 10c comprises memory cells 50c within an array 52c. The memory cells 50c are analogous to the memory cells 50b of FIG. 16. However, there is a difference in that the upper surfaces 27 of the bottom electrodes 26 are beneath the interface 17 between the materials 16 and 18. According, the vertically-extending surface 29 extends along material 16, and also along an upper region of the material 18. In some embodiments, the materials 16 and 18 comprise silicon nitride and silicon dioxide, respectively. In such embodiments, the configuration of FIG. 16 has the leaker device material 40 extending only along the silicon nitride of material 16 of the vertically-extending surface 29 of the supporting material 14, whereas the configuration of FIG. 18 has the leaker device material 40 extending along both the silicon nitride of material 16 and the silicon dioxide of material 18.

Figure 19:
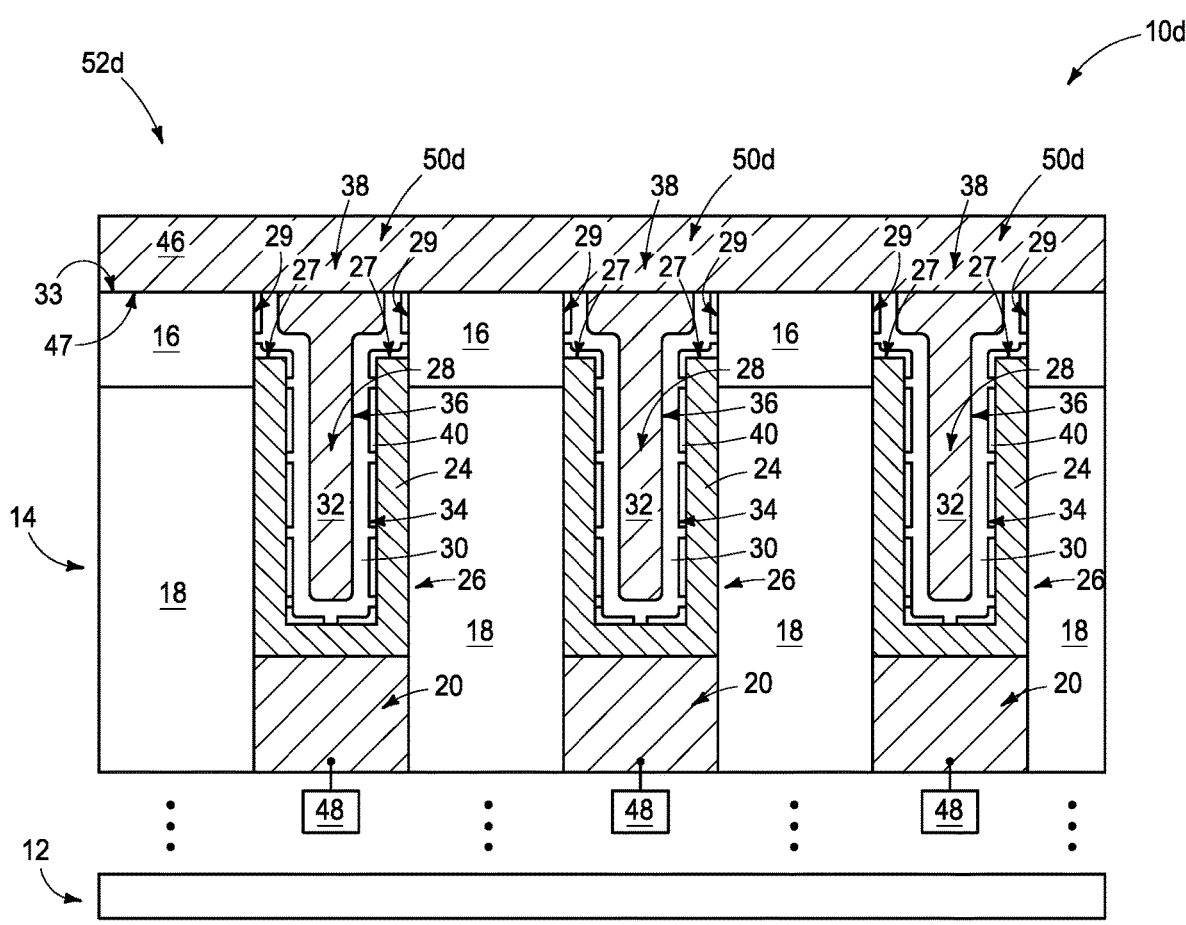
FIG. 19 is a diagrammatic cross-sectional view of an example assembly at an example process stage alternative to that of FIG. 16.
Figure 20:
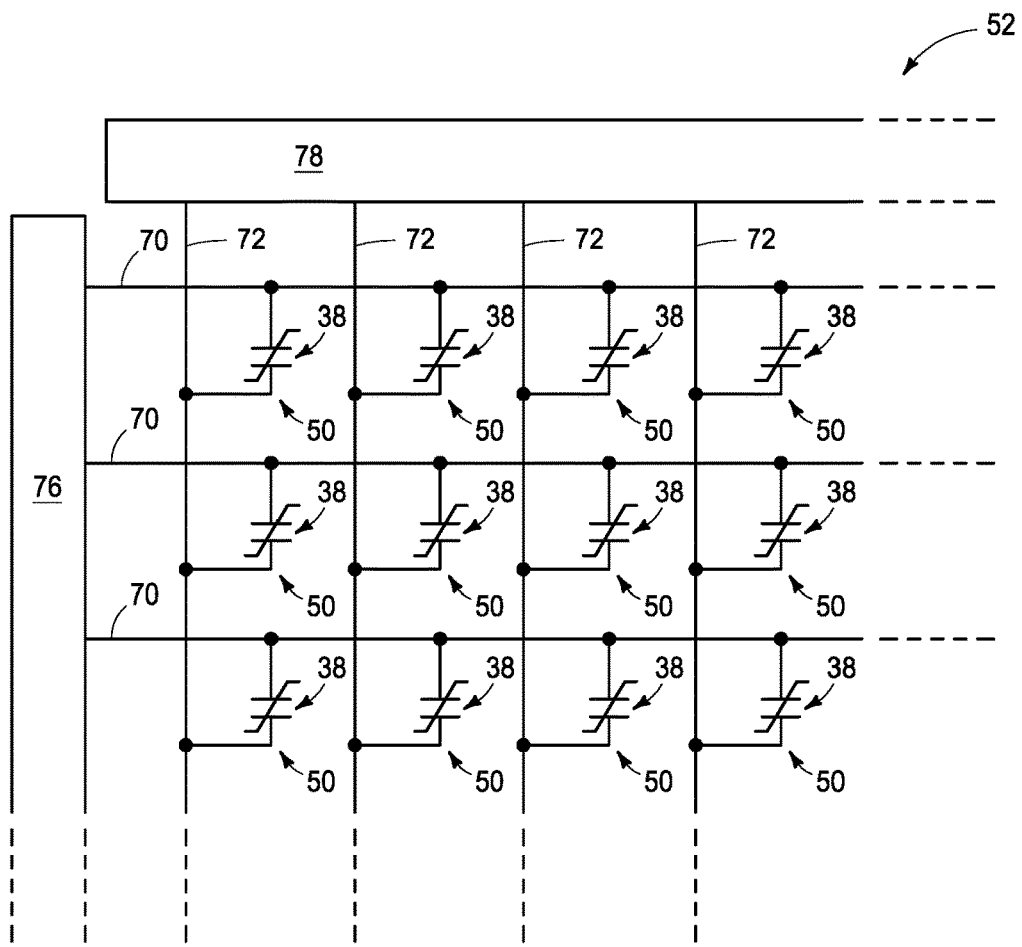
FIG. 20 is a schematic diagram of an example memory array comprising ferroelectric capacitors.

The leaker device material 40 shown in the above-described embodiments of FIGS. 1-18 is a continuous layer. In other embodiments, the leaker device material may be a discontinuous layer. For instance, FIG. 19 shows an assembly 10d analogous to the assembly 10b of FIG. 16, but in which the leaker device material 40 is a discontinuous film. The openings extending through the leaker device material 40 may be very small, and in some embodiments may be pinhole openings. The assembly of FIG. 10d is shown having the capacitors 38 incorporated into memory cells 50d, which in turn are comprised by a memory array 52d.

The memory arrays described above (e.g., memory array 52 of FIG. 9, memory array 52b of FIG. 16, etc.) may be ferroelectric memory arrays, and may have any suitable configuration. An example ferroelectric memory array 52 is described with reference to FIG. 20. The memory array includes a plurality of substantially identical ferroelectric capacitors 38. Wordlines 70 extend along rows of the memory array, and digit lines 72 extend along columns of the memory array. Each of the capacitors 38 is within a memory cell 50 which is uniquely addressed utilizing a combination of a wordline and a digit line. The wordlines 70 extend to driver circuitry 76, and the digit lines 72 extend to detecting circuitry 78. In some applications, the memory array 52 may be configured as ferroelectric random access memory (FeRAM).

Figure 21:
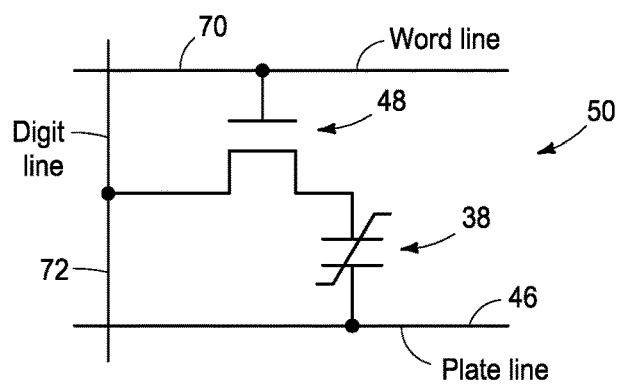
FIG. 21 is a schematic diagram of an example memory cell comprising a ferroelectric capacitor.

The memory cells 50 may include transistors 48 in combination with the ferroelectric capacitors. For instance, in some applications each of the memory cells 50 may include a transistor 48 in combination with a ferroelectric capacitor 38, as shown in FIG. 21. The memory cell 50 is shown coupled with a wordline 70 and a digit line 72. Also, one of the electrodes of the capacitor 38 is shown coupled with a plate line comprising the plate material 46. The plate line may be utilized in combination with the wordline 70 for controlling an operational state of the ferroelectric capacitor 38.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an apparatus. Openings are formed to extend into a supporting structure. The openings are lined with bottom electrode material. The bottom electrode material within each opening is configured as an upwardly-opening container-shaped bottom electrode having an interior region. An upper surface of each upwardly-opening container-shaped bottom electrode is recessed to below an upper surface of the supporting structure. The interior regions of the upwardly-opening container-shaped bottom electrodes are lined with insulative material to narrow the interior regions of the upwardly-opening container-shaped bottom electrodes. Upper electrodes are formed within the narrowed interior regions of the upwardly-opening container-shaped bottom electrodes. The upper electrodes, insulative material and upwardly-opening container-shaped bottom electrodes together forming a plurality of capacitors. Plate material is formed to extend across the upper electrodes and to couple the upper electrodes to one another. Leaker devices are formed to electrically couple the bottom electrodes to the plate material.

Some embodiments include a method of forming an apparatus. Openings are extended into a supporting structure. The supporting structure has an upper surface between the openings. The openings are lined with bottom electrode material. The bottom electrode material within each opening is configured as an upwardly-opening container-shaped bottom electrode having an interior region. An upper surface of each upwardly-opening container-shaped bottom electrode is recessed to below an upper surface of the supporting structure. Each of the openings has an exposed vertically-extending surface of the supporting structure above the recessed upper surface of the upwardly-opening container-shaped bottom electrode contained therein. Leaker device material is formed over the upper surface of the supporting structure; along the exposed vertically-extending surfaces of the supporting structure, and within the interior regions of the upwardly-opening container-shaped bottom electrodes. Insulative material is formed over the leaker device material. The insulative material extends to within the interior regions of the upwardly-opening container-shaped bottom electrodes to narrow the interior regions of the upwardly-opening container-shaped bottom electrodes. Upper electrodes are formed within the narrowed interior regions of the upwardly-opening container-shaped bottom electrodes. The upper electrodes, insulative material and upwardly-opening container-shaped bottom electrodes together form a plurality of capacitors. Plate material is formed to extend across the upper electrodes and to couple the upper electrodes to one another. The plate material is directly against the leaker device material. The leaker device material electrically couples the bottom electrodes to the plate material, and is configured to discharge at least a portion of excess charge from the upwardly-opening container-shaped bottom electrodes to the plate material.

Some embodiments include an apparatus having horizontally-spaced upwardly-opening container-shaped bottom electrodes supported by a supporting structure. Upper surfaces of the upwardly-opening container-shaped bottom electrodes are below an upper surface of the supporting structure. Vertically-extending surfaces of the supporting structure are above the upper surfaces of the upwardly-opening container-shaped bottom electrodes. Leaker device material is along the vertically-extending surfaces of the supporting structure, and within interior regions of the upwardly-opening container-shaped bottom electrodes. Insulative material is over the leaker device material and within the interior regions of the upwardly-opening container-shaped bottom electrodes. The insulative material is configured as upwardly-opening container-shaped insulative structures within the upwardly-opening container-shaped bottom electrodes. Upper electrodes extend into the upwardly-opening container-shaped insulative structures. the upper electrodes, upwardly-opening container-shaped insulative structures and upwardly-opening container-shaped bottom electrodes are together comprised by a plurality of capacitors. Plate material extends across the upper electrodes and couples the upper electrodes to one another. The plate material is directly against the leaker device material. The leaker device material electrically couples the bottom electrodes to the plate material, and is configured to discharge at least a portion of excess charge from the upwardly-opening container-shaped bottom electrodes to the plate material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an apparatus, comprising:
   forming openings extending into a supporting structure, the supporting structure having an upper surface between the openings;
   lining the openings with bottom electrode material, the bottom electrode material within each opening forming an upwardly-opening container-shaped bottom electrode having an interior region; an upper surface of each upwardly-opening container-shaped bottom electrode being recessed to below an upper surface of the supporting structure; each of the openings having an exposed vertically-extending surface of the supporting structure above the recessed upper surface of the upwardly-opening container-shaped bottom electrode contained therein;
   forming leaker device material over the upper surface of the supporting structure; along the exposed vertically-extending surfaces of the supporting structure, and within the interior regions of the upwardly-opening container-shaped bottom electrodes;
   forming insulative material over the leaker device material; the insulative material extending to within the interior regions of the upwardly-opening container-shaped bottom electrodes to narrow the interior regions of the upwardly-opening container-shaped bottom electrodes;

forming upper electrodes within the narrowed interior regions of the upwardly-opening container-shaped bottom electrodes; the upper electrodes, insulative material and upwardly-opening container-shaped bottom electrodes together forming a plurality of capacitors; and forming plate material extending across the upper electrodes and coupling the upper electrodes to one another; the plate material being directly against the leaker device material; the leaker device material electrically coupling the bottom electrodes to the plate material and being configured to discharge at least a portion of excess charge from the upwardly-opening container-shaped bottom electrodes to the plate material.

2. The method of claim 1 wherein the insulative material is ferroelectric insulative material.

3. The method of claim 1 wherein the leaker device material comprises one or more of Ti, Ni and Nb, in combination with one or more of Ge, Si, O, N and C.

4. The method of claim 1 wherein the leaker device material comprises one or more of Si, Ge, SiN, TiSiN, TiO, TiN, NiO, NiON and TiON; where the chemical formulas indicate primary constituents rather than particular stoichiometries.

5. The method of claim 1 wherein the forming of the leaker device material comprises:

depositing a first composition over the upper surface of the supporting structure, along the exposed vertically-extending surfaces of the supporting structure, and within the interior regions of the upwardly-opening container-shaped bottom electrodes; the first composition having a first conductivity;

chemically modifying the first composition convert the first composition into a second composition having a second conductivity which is less than the first conductivity.

6. The method of claim 5 wherein the chemical modification of the first composition comprises oxidation of the first composition.

7. The method of claim 5 wherein the first composition comprises TiN, where the chemical formula indicates primary constituents rather than a particular stoichiometry; and wherein the chemical modification of the first composition comprises oxidation of the first composition to form the second composition to comprise TiON, where the chemical formula indicates primary constituents rather than a particular stoichiometry.

8. The method of claim 7 wherein the oxidation comprises exposure of the TiN to ozone.

9. The method of claim 1 wherein the insulative material extends over the upper surface of the supporting structure; along the exposed vertically-extending surfaces of the supporting structure, and within the interior regions of the upwardly-opening container-shaped bottom electrodes; and wherein the forming of the upper electrodes comprises:

forming upper electrode material over insulative material; with the upper electrode material extending over the upper surface of the supporting structure, along the exposed vertically-extending surfaces of the supporting structure, and within the interior regions of the upwardly-opening container-shaped bottom electrodes;

the upper electrode material, insulative material, leaker device material, and bottom electrode material together forming an assembly; and polishing an upper surface of the assembly to remove the upper electrode material from over the upper surface of the supporting structure.

10. The method of claim 9 wherein the polishing also removes the insulative material and the leaker device material from over the upper surface of the supporting structure.

11. The method of claim 1 wherein the plate material comprises a different composition than the upper electrode material.

12. The method of claim 1 wherein the support structure comprises silicon nitride over silicon dioxide; and wherein the exposed vertically-extending surfaces of the supporting structure only comprise the silicon nitride.

13. The method of claim 1 wherein the support structure comprises silicon nitride over silicon dioxide; and wherein the exposed vertically-extending surfaces of the supporting structure comprise the silicon nitride and an upper region of the silicon dioxide.

14. An apparatus, comprising:

horizontally-spaced upwardly-opening container-shaped bottom electrodes supported by a supporting structure; upper surfaces of the upwardly-opening container-shaped bottom electrodes being below an upper surface of the supporting structure; vertically-extending surfaces of the supporting structure being above the upper surfaces of the upwardly-opening container-shaped bottom electrodes;

leaker device material along the vertically-extending surfaces of the supporting structure, and within interior regions of the upwardly-opening container-shaped bottom electrodes;

insulative material over the leaker device material and within the interior regions of the upwardly-opening container-shaped bottom electrodes; the insulative material being configured as upwardly-opening container-shaped insulative structures within the upwardly-opening container-shaped bottom electrodes;

upper electrodes extending into the upwardly-opening container-shaped insulative structures; the upper electrodes, upwardly-opening container-shaped insulative structures and upwardly-opening container-shaped bottom electrodes together comprise a plurality of capacitors; and plate material extending across the upper electrodes and coupling the upper electrodes to one another; the plate material being directly against the leaker device material; the leaker device material electrically coupling the bottom electrodes to the plate material and being configured to discharge at least a portion of excess charge from the upwardly-opening container-shaped bottom electrodes to the plate material.

15. The apparatus of claim 14 wherein the leaker device material comprises one or more of Ti, Ni and Nb, in combination with one or more of Ge, Si, O, N and C.

16. The apparatus of claim 14 wherein the leaker device material comprises one or more of Si, Ge, SiN, TiSiN, TiO, TiN, NiO, NiON and TiON; where the chemical formulas indicate primary constituents rather than particular stoichiometries.

17. The apparatus of claim 14 wherein the leaker device material comprises titanium, oxygen and nitrogen.

18. The apparatus of claim 14 wherein the insulative material is ferroelectric insulative material.

19. The apparatus of claim 14 wherein the supporting structure comprises a first material over a second material, with an interface between the first and second materials is at or below an elevational level of the upper surfaces of the upwardly-opening container-shaped bottom electrodes.

20. The apparatus of claim 14 wherein the supporting structure comprises a first material over a second material, with an interface between the first and second materials being above the upper surfaces of the upwardly-opening container-shaped bottom electrodes.

* * * * *